(12) United States Patent
Matsuoka et al.

(10) Patent No.: US 7,474,377 B2
(45) Date of Patent: Jan. 6, 2009

(54) COATING AND DEVELOPING SYSTEM

(75) Inventors: Nobuaki Matsuoka, Koshi-Machi (JP); Shinichi Hayashi, Koshi-Machi (JP); Yasushi Hayashida, Koshi-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 287 days.

(21) Appl. No.: 11/373,118

(22) Filed: Mar. 13, 2006

(65) Prior Publication Data

US 2006/0201616 A1    Sep. 14, 2006

Related U.S. Application Data

(63) Continuation-in-part of application No. 11/156,571, filed on Jun. 21, 2005.

(30) Foreign Application Priority Data

Mar. 11, 2005   (JP)   ............................. 2005-069682
Oct. 12, 2005   (JP)   ............................. 2005-297989

(51) Int. Cl.
  *G03B 27/42*   (2006.01)
(52) U.S. Cl. ......................................... 355/27; 355/53

(58) Field of Classification Search ................. 396/611; 355/27–29, 53
See application file for complete search history.

(56) References Cited

U.S. PATENT DOCUMENTS 7,267,497 B2 *  9/2007  Akimoto et al. ............. 396/611
7,281,869 B2 * 10/2007  Akimoto et al. ............. 396/611

FOREIGN PATENT DOCUMENTS

JP    3337677       8/2002
JP    2004-193597   7/2004

* cited by examiner

*Primary Examiner*—Della J. Rutledge
(74) *Attorney, Agent, or Firm*—Oblon, Spivak, McClelland, Maier & Neustadt, P.C.

(57) ABSTRACT

A coating and developing system for enabling maintenance of an exposure system combined therewith. The system carries a substrate, delivered to a carrier handling block, to a processing block to form a film thereon using a coating block included in the processing block. The substrate is carried through an interface block to the exposure system, the exposed substrate is processed by a developing process using a developing block included in the processing block and the processed substrate is returned to the carrier handling block. A direct carrying means is superposed on the coating block and the developing block to carry a substrate having a surface coated with a film from the carrier handling block directly to the interface block. A test substrate can be carried to the exposure system to inspect the condition of the exposure system even where the coating and developing blocks are under maintenance work.

17 Claims, 14 Drawing Sheets

US 7,474,377 B2

COATING AND DEVELOPING SYSTEM

TECHNICAL FIELD

The present invention relates to a coating and developing system for applying a liquid resist to a surface of a substrate, such as a semiconductor wafer or a glass substrate for a liquid crystal display to coat the surface with a resist film and developing the exposed resist film.

BACKGROUND ART

A series of processes for forming a resist pattern on a substrate, such as a semiconductor wafer (hereinafter referred to simply as "wafer") is carried out by a resist pattern forming system including, in combination, a coating and developing system for applying a liquid resist to the surface of a substrate to form a resist film and developing the exposed resist film, and an exposure system.

A coating and developing system disclosed in, for example, Patent document 1 includes a film forming block including coating modules for processing a wafer by a coating process before the wafer is subjected to an exposure process, and a developing block including developing modules for processing the wafer processed by the exposure process by a developing process. The coating block and the developing block are superposed. Each of the coating block and the developing block has one end connected to a loading/unloading port and the other end connected to an exposure system by an interface block. This known coating and developing system performs the coating process and the developing process separately to enhance throughput.

The resolution of the exposure system has been improved in recent years. According to the present status of art, the exposure process is capable of achieving a resolution on the order of several tens nanometers by using, for example, an ArF light source (argon fluoride light source). However, the position of a point where light is to be focused is sensitively affected by, for example, the expansion or contraction of a holding member included in an optical system due to a slight change in the environmental condition caused by changes in the atmospheric pressure and weather. The quality of a resist pattern is greatly dependent on such a change of the position of a point where light is to be focused. Therefore, the exposure system needs to be inspected and adjusted frequently, for example, in one day.

There is a tendency to lower the cleanliness of a clean room to reduce the operating cost of a plant. Therefore, the inspection of the exposure system is performed by carrying a test wafer from the carrier handling block of the coating and developing system into the exposure system by the carrying system of the processing block without opening the maintenance door of the exposure system. The coating and developing system mentioned in Patent document 1 needs to use either the coating block or the developing block to carry the test wafer to the exposure system. Therefore, the periodic or occasional inspection and adjustment of the exposure system cannot be done if the coating block and the developing block are under maintenance work or are out of order. Thus the test wafer is carried into the exposure system for the inspection and adjustment of the exposure system after the completion of maintenance work for the coating block and the developing block. Consequently, wafers cannot be processed immediately after the completion of maintenance work for the coating and the developing block, which is one of causes that reduce the throughput of the coating and developing system.

It is an important theme to start up a newly installed semiconductor device fabricating line in a short time. The configuration of the system disclosed in Patent document 1 does not permit the adjustment of the exposure system unless the adjustment of the carrying system of the coating block or the developing block is completed. Since the exposure system has many adjustment items requiring fine adjustment, the adjustment of the exposure system takes a long time. Consequently, it is difficult to reduce time necessary before starting up the semiconductor device fabricating line.

Patent document 1: Jpn. Pat. No. 3337677

DISCLOSURE OF THE INVENTION

The present invention has been made under such circumstances and it is therefore an object of the present invention to provide a coating and developing system that permits maintenance work for an exposure system to be performed at desired time.

A coating and developing system according to the present invention includes: a carrier handling block for receiving a carrier containing substrates; a processing block for forming films including a photosensitive film on a substrate received from the carrier handling block for developing the exposed photosensitive film processed by an exposure process by an exposure system and returning the substrate to the carrier handling block; an interface block for transferring the substrate from the processing block to the exposure system and transferring the substrate from the exposure system to the processing block; wherein a) the processing block has coating blocks, for forming the films including the photosensitive film on the substrate, extending between the carrier handling block and the interface block, and a developing block superposed on the coating blocks, b) each of the coating blocks and the developing block is provided with a chemical liquid applying unit for applying a chemical liquid to the substrate, a heating unit for heating the substrate, a cooling unit for cooling the substrate and interblock carrying means for carrying the substrate from one to another of those units, c) a direct carrying means is superposed on the coating block and the developing block to carry a substrate directly between the carrier handling block and the interface block, and d) the direct carrying means carries a substrate coated with the films from a position on the side of the carrier handling block to a position on the side of the interface block.

The coating block may include a layered structure of a resist film forming block for forming a resist film, a first antireflection film forming block for forming a first antireflection film under the resist film, and a second antireflection film forming block for forming a second antireflection film over the resist film. The developing block may be disposed below the coating block.

The direct carrying means may be formed to move in a carrying block separated from the coating block and the developing block. The carrying block lies between the coating block and the developing block. The carrying block may be provided with a gas inlet through which a gas is supplied into the carrying block to maintain the carrying block at a positive pressure.

The coating and developing system according to the present invention may include an interblock carrying means for the coating block, an interblock carrying means for the developing block, a plurality of transfer stages stacked up in layers so that a substrate can be transferred between each of the stages and the direct carrying means, and a vertical carrying means capable of transferring a substrate from one to another of the transfer stages. The coating and developing system may include a controller for controlling carrying operations for carrying a substrate, capable of selecting a test substrate carrying mode for carrying a test substrate from the carrier handling block to the exposure system by the direct carrying means to test the condition of the exposure system.

The coating and developing system according to the present invention may further include an auxiliary block interposed between the processing block and the interface block and including units that carries out a process at a stage after a film has been formed and before an exposure process and/or at a stage after an exposure process has been completed and before a developing process, transfer arms for carrying a substrate between each of those units and the processing block and between each of those units and the interface block; wherein the direct carrying means may include a first direct carrying means that passes through the processing block and a second direct carrying means that passes through the auxiliary block, an inspection block including an inspection unit for inspecting a substrate and a transfer arm for transferring a substrate from and to the inspection unit, the carrier block and the processing block and disposed between the carrier block and the processing block, and the direct carrying means may include a third direct carrying means that passes through the inspection block and a first direct carrying means that passes through the processing block.

The processing block of the coating and developing system according to the present invention is formed by superposing the coating block extending between the carrier handling block and the interface block, and the developing block. Therefore, the coating and the developing system needs a narrow floor space for installation. Since the coating and developing system is provided with the direct carrying means specially for carrying a substrate directly between the carrier handling block and the interface block, Maintenance operations for the maintenance of the exposure system, the coating block and the developing block can be simultaneously executed to reduce time necessary for completing the maintenance operations. Even if the coating and the developing block are under maintenance work or even if troubles are caused in the coating and the developing block, for example, due to the malfunction of a discharge system, a test substrate for testing the condition of the exposure system can be carried from the carrier handling block to the exposure system by the direct carrying means and hence the inspection of the condition of the exposure system can be timed as desired. Therefore, processes for processing a substrate can be started immediately after the coating block and the developing block have become operative and hence the reduction of throughput can be suppressed. Adjusting work for adjusting the exposure system can be executed separately from adjusting work for adjusting the block carrying means of the coating and the developing block by carrying a test substrate by the direct carrying means, provided that the direct carrying means is adjusted when the coating and developing system is installed, developing conditions can be set if the adjustment of the exposure system has been completed. Consequently, time for starting up the coating and developing system can be curtailed.

BEST MODE FOR CARRYING OUT THE INVENTION

Figure 1:
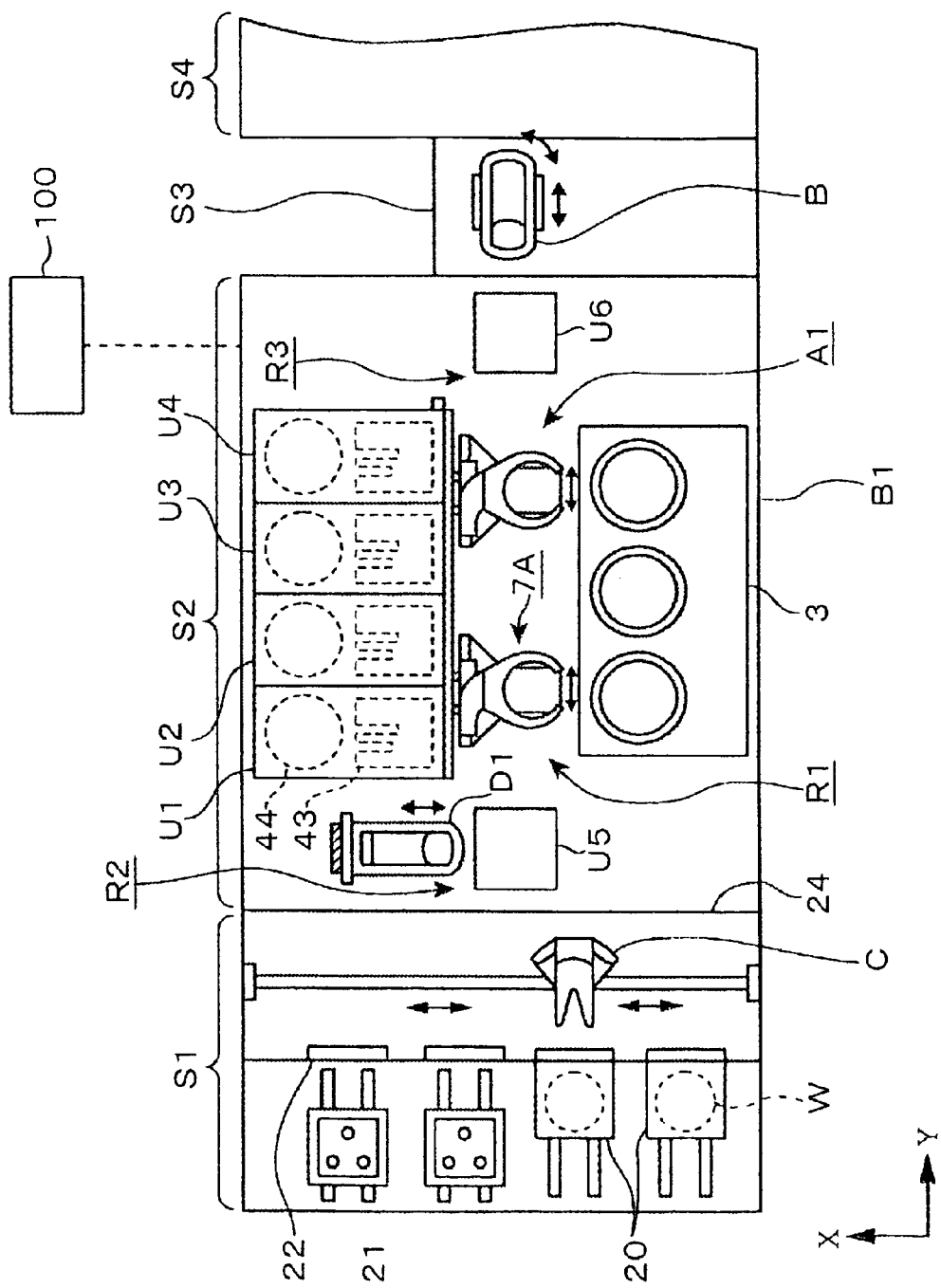
FIG. 1 is a plan view of a coating and developing system in a first embodiment according to the present invention.
Figure 2:
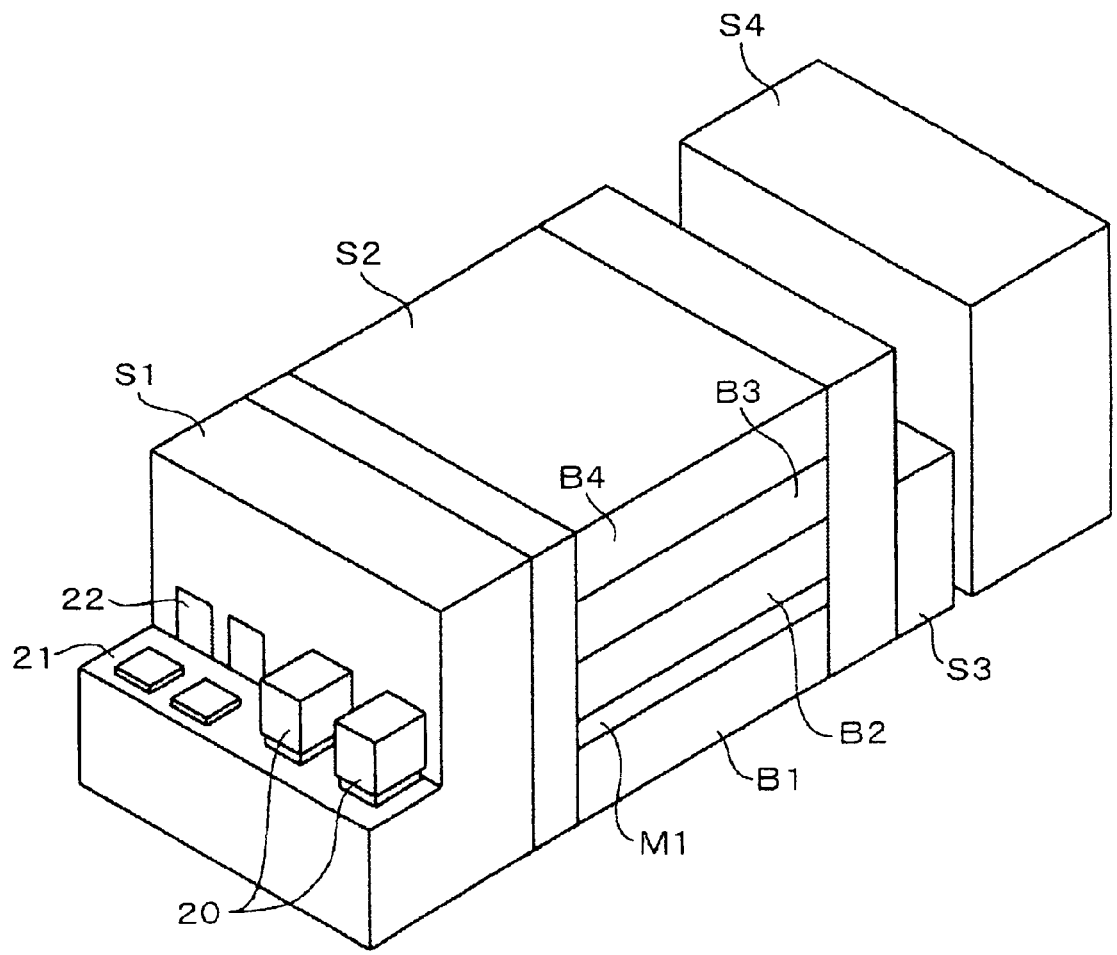
FIG. 2 is a perspective view of the coating and developing system shown in FIG. 1.
Figure 3:
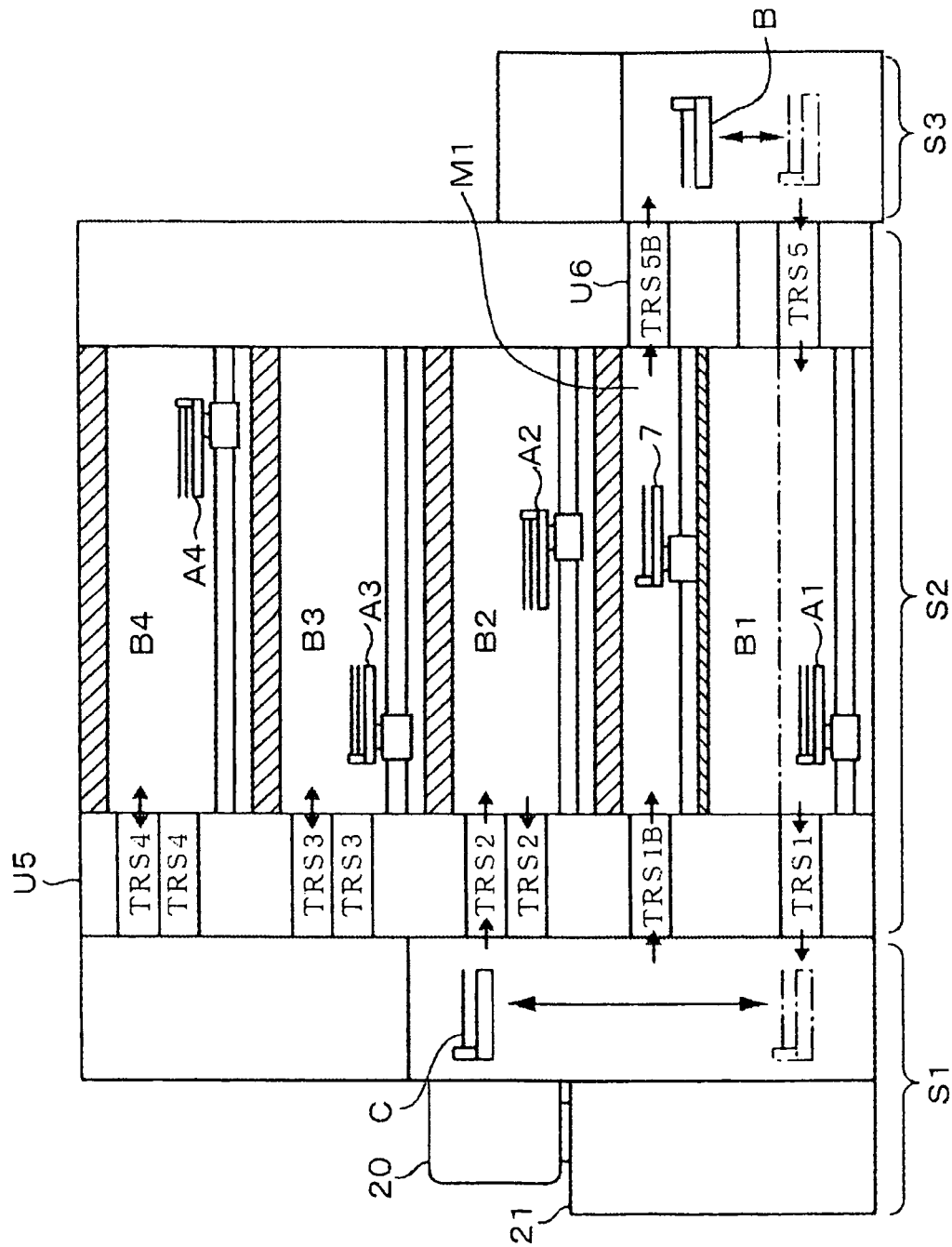
FIG. 3 is a sectional side elevation of the coating and developing system shown in FIG. 1.

A coating and developing system in a first embodiment according to the present invention combined with an exposure system will be described. FIG. 1 is a plan view of the coating and developing system, FIG. 2 is a schematic perspective view of the coating and developing system and FIG. 3 is a schematic side elevation of the coating and developing system. The coating and developing system is installed in a clean room in an atmospheric atmosphere. The coating and developing system has a carrier handling block S1, a processing block S2 formed by perpendicularly stacking up, for example, four unit blocks B1 to B4 and a carrying block M1 and an interface block S3. The coating and developing system is combined with an exposure system S4. A closed carrier 20 containing, for example, thirteen wafers W, namely, substrates, is delivered to and is sent out from the carrier handling block S1.

The carrier handling block S1 has a carrier support table 21 capable of supporting a plurality of carriers 20 thereon, gates 22 formed in a wall behind the carrier support table 21, and a transfer arm C capable of extending through the gate 22 to the carrier 20 to take out the wafer W from the carrier 20. The transfer arm C is able to move in horizontal directions and vertical directions, to turn about a vertical axis and to move in directions parallel to a direction in which the carriers 20 are arranged to transfer the wafer W between transfer stages TRS1 and TRS2 of the unit blocks B1 and B2.

The processing block S2 surrounded by a casing 24 is connected to the back end of the carrier handling block S1. In this embodiment, the processing block S2 includes the first unit block (DEV layer) B1 for carrying out a developing process, the carrying block M1, the second unit block (BCT layer) B2 for forming a lower antireflection film under a resist film, the third unit block (COT layer) B3 for carrying out a liquid resist applying process, and the fourth unit block (TCT layer) B4 for forming an upper antireflection film over the resist film. The unit blocks B1 to B4 are stacked upward in that order. The unit blocks B1 to B4 and the carrying block M1 are extended from the carrier handling block S1 toward the interface block S3. The DEV layer B1 corresponds to a developing block, and the BCT layer B2, the COT layer B3 and the TCT layer B4 correspond to coating blocks for forming a resist film of a photosensitive resist. The unit blocks B1 to B5 are arranged vertically upward in that order. The DEV layers B1 and B2 are developing unit blocks, the TCT layer B3, the COT layer B4 and the BCT layer B5 are film forming unit blocks for forming a film of a photosensitive material, such as a photosensitive resist. The unit blocks B1 to B4 and the carrying block M1 are separated by partition plates (base members).

Figure 4:
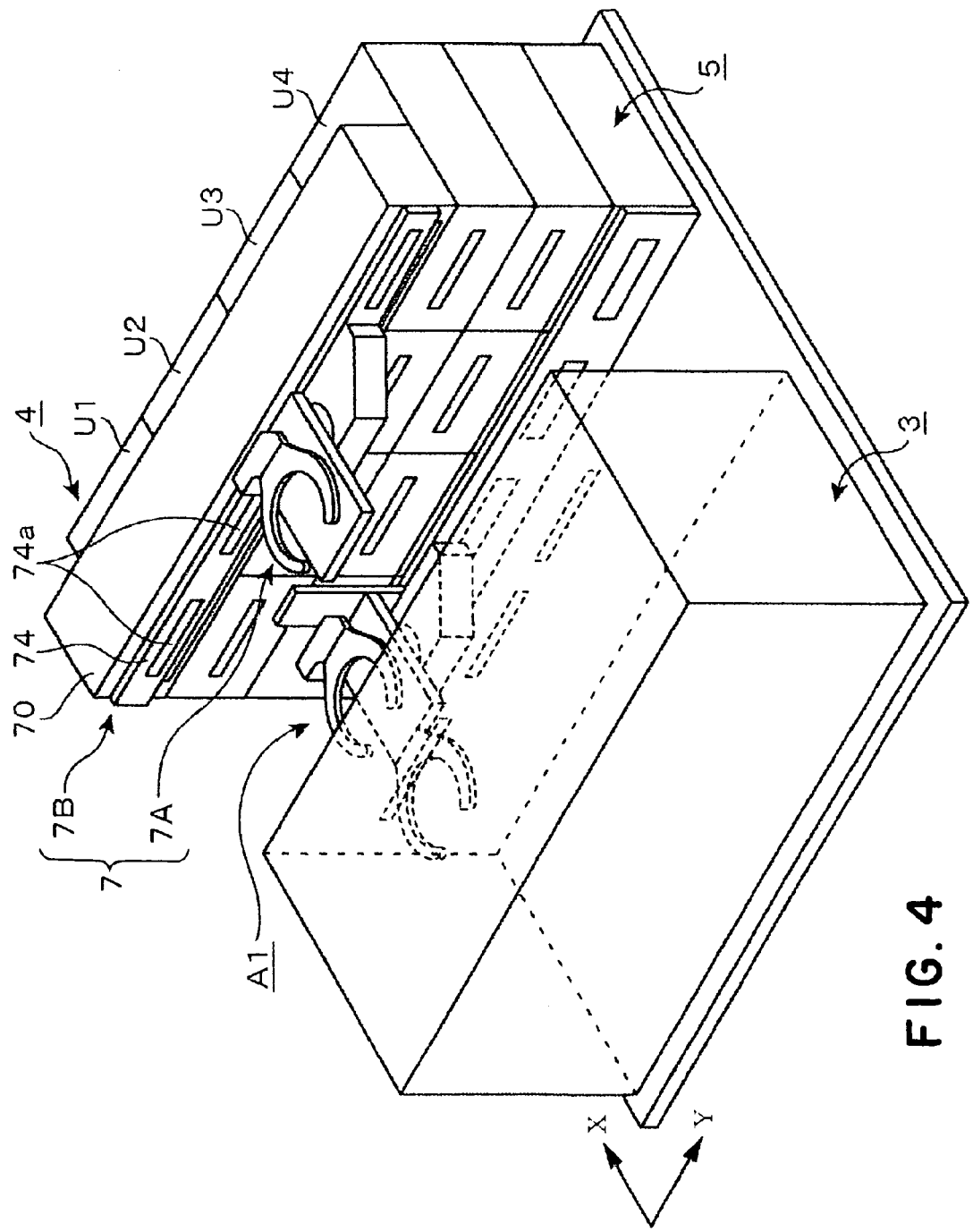
FIG. 4 is a perspective view of a developing unit on a DEV layer, a shelf unit, a main arm and a discharge unit included in the coating and developing system shown in FIG. 1.

The first to the fourth unit block B (the reference character B denotes the first unit block B1, the second unit block B2, the third unit block B3 and the fourth unit block B4 inclusively) will be described. The unit blocks B1 to B4 have many same parts and are substantially similar in layout. Therefore the DEV layer B1 will be described by way of example with reference to FIG. 1. A wafer carrying passage R1 along which a wafer W is carried extends along the length of the DEV layer B1, i.e., in a direction parallel to the Y-axis as viewed in FIG. 1 between the carrier handling block S1 and the interface block S3, A developing unit 3, namely, liquid application unit, having a plurality of liquid application devices for applying a developer to a wafer is disposed on the right side, with respect to a direction from the carrier handling block S1 toward the interface block S3, of the wafer carrying passage R1. Four shelf units U1, U2, U3 and U4 formed by stacking up thermal processing devices of heating and cooling systems are arranged in that order on the left side, with respect to a direction from the carrier handling block S1 toward the interface block S3, of the wafer carrying passage R1. Thus the developing unit 3 and the shelf units U1 to U4 are disposed on the opposite sides of the wafer carrying passage R1. Each of the shelf units U1 to U4 has two thermal processing devices stacked up in two layers. The thermal processing devices carry out a pretreatment before a developing process to be carried out by the developing unit 3 and a posttreatment after the developing process. A discharge unit 5 underlies the shelf units U1 to U5 as shown in FIG. 4.

The thermal processing devices include heating devices 4 for heating a wafer W processed by an exposure process, heating devices for heating a wafer W for drying after a developing process and cooling devices for cooling a wafer W heated by the heating device 4 to adjust the temperature of the wafer W to a predetermined temperature. Each of the shelf units U1, U2 and U3 of the DEV layer B1 has two heating devices 4 put one on top of the other, and the shelf layer U4 has two cooling devices put one on top of the other.

Figure 5:
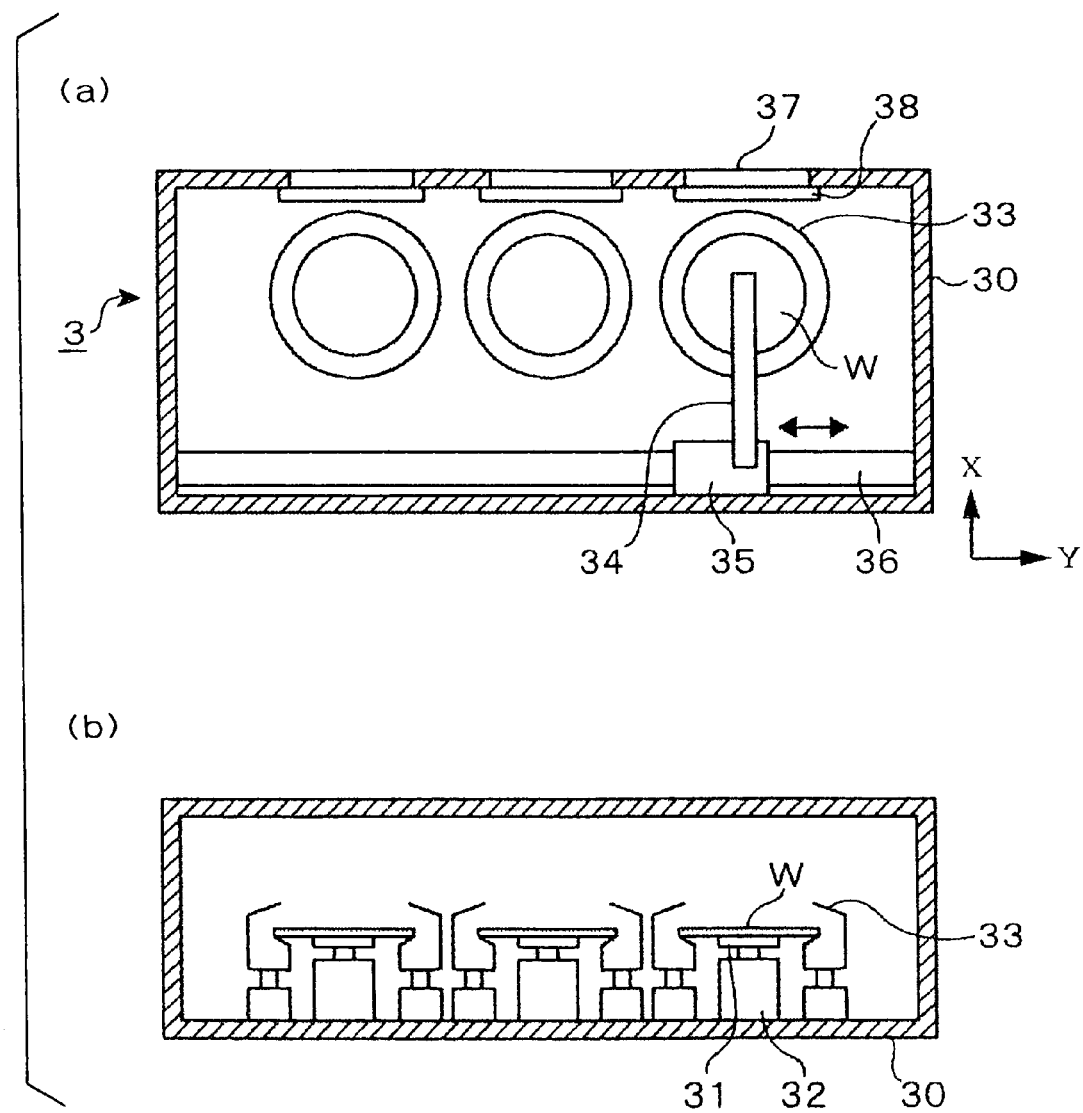
FIGS. 5A and 5B are a plan view and a longitudinal sectional view, respectively, of a developing unit included in the coating and developing system shown in FIG. 1.

The construction of the developing unit 3 will be briefly described with reference to FIG. 5. Three spin chucks 31, namely, wafer support devices, are arranged in a box 30 included in the developing unit 3. Each spin chuck 31 is so supported as to be driven for rotation about a vertical axis by a driving device 32 and to be vertically movable. A cup 33 surrounds the spin chuck 31. A draining device, not shown, including a discharge pipe and a drain pipe is connected to the bottom wall of the cup 33. A chemical liquid pouring nozzle 34 is vertically movable. The chemical liquid supply nozzle 34 is moved along a guide 36 extended parallel to the Y-axis by a driving device 35.

Gates 37 are formed in a side wall, facing the wafer carrying passage R1, of the box 30 of the developing unit 3. A main arm A1 carries a wafer W through the gate 37 into the box 30 and transfers the wafer W to the spin chuck 31. Openable shutters 38 cover the gates 37, respectively, to prevent the flow of particles into the box 30. A developer is poured onto the surface of the wafer W through the chemical liquid supply nozzle 34 to coat the surface of the wafer W with a developer film. A cleaning liquid supply mechanism, not shown, pours a cleaning liquid onto the wafer W to wash off the developer from the surface of the wafer W. Then, the wafer W is dried by rotating the spin chuck 31 supporting the wafer W to complete the developing process.

Figure 6:
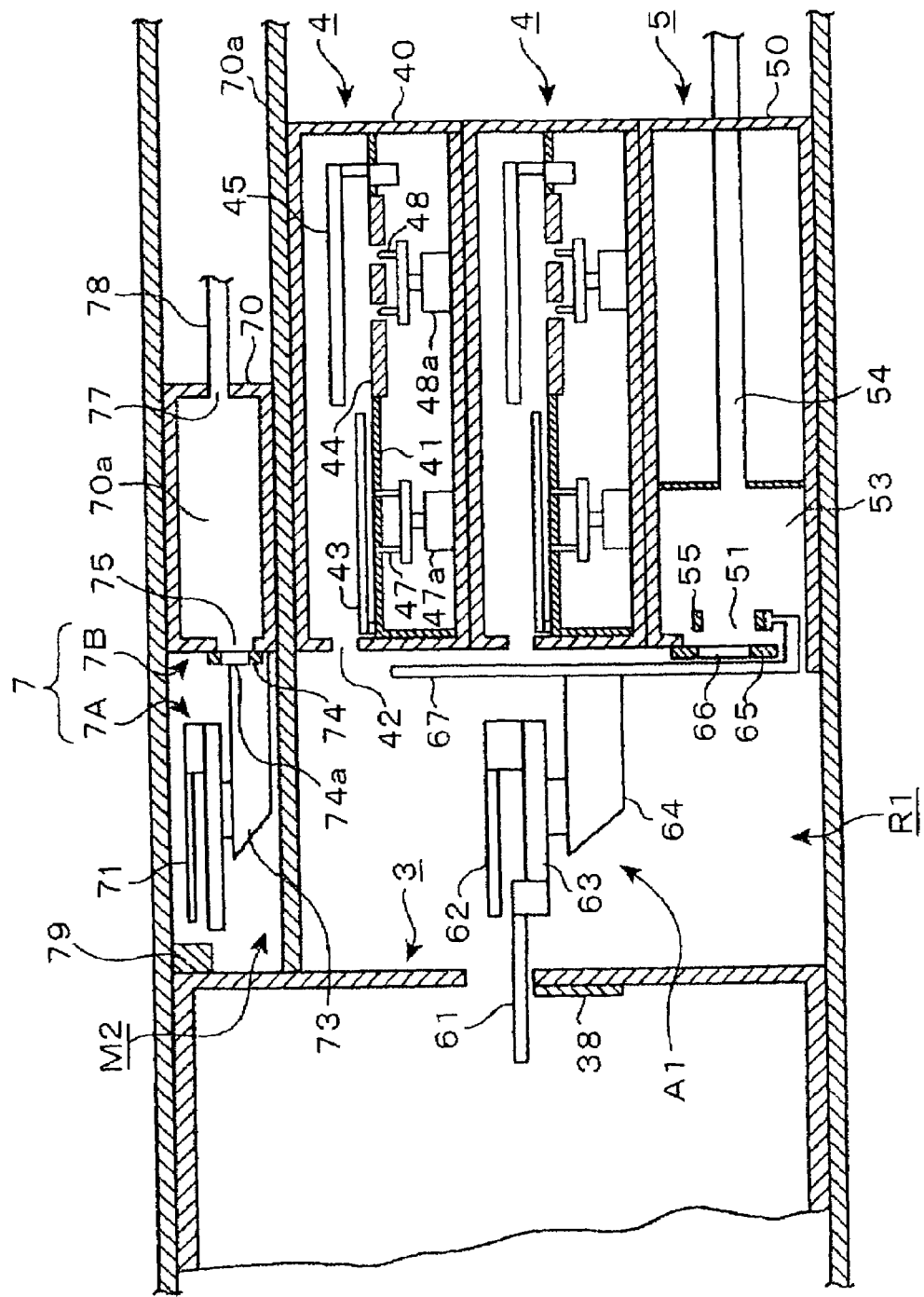
FIG. 6 is a longitudinal sectional view of the DEV layer.

Each of the heating devices 4 included in the shelf units U1 to U3 will be briefly described. Referring to FIG. 6, a base 41 is disposed in a box 40. A gate 41 is formed in a wall, facing the wafer carrying passage R1, of the box 40. Shown in FIG. 6 are cooling plate 3 for preparatory cooling, heating plate 44, a deflecting plate 45, vertically movable lifting pins 47 and 48, and lifting mechanisms 47a and 48a respectively for vertically moving the lifting pins 47 and 48. The cooling plate 43 can be moved on the base 41 onto the heating plate 44. The lifting pins 47 are moved vertically to transfer the wafer W between the main arm A1 and the cooling plate 43. The lifting pins 48 are moved vertically to transfer the wafer W between the cooling plate 43 and the heating plate 44.

The cooling unit has a box 40 having a wall facing the wafer carrying passage R1 and provided with a gate 42, and a water-cooled cooling plate placed in the box 40. Further description of the cooling unit will be omitted because the cooling unit included in the shelf unit U4 is similar in construction to the heating units 4.

The discharge unit 5 has a box 50 defining a discharge chamber and having a wall facing the wafer carrying passage R1 and provided with suction openings 51, a discharge pipe 54 connected to the box 50. Gas is sucked through the discharge pipe 54 to evacuate the discharge chamber 53 of the box 50 at a negative pressure. Consequently, gas is sucked from the wafer carrying passage R1 to remove particles floating in the wafer carrying passage R1.

The main arm A1, namely, a block carrying means, that operates in the wafer carrying passage R1 will be described. The main arm A1 carries a wafer W from one to another of the processing devices of the shelf units U1 to U4, the developing unit 3 and the respective transfer stages of the shelf unit U5 and a shelf unit U6. For example, the main arm A1 has two arm members 61 and 62 capable of coming into contact with a peripheral part of the back surface of a wafer W to support the wafer W thereon. The arm members 61 and 62 are supported on a base 63 for individual forward and backward movement. The base 63 is supported on a lifter base 64 so as to be turnable abut a vertical axis. A guide rail 65 guides the main arm A1 for transverse movement. The guide rail 65 is provided with openings 66 corresponding to the suction openings 51. Gas is sucked from the wafer carrying passage R1 through the openings 66. A vertical guide rail 67 guides the lifter base 64 for vertical movement. A lower end part of the vertical guide rail 67 is formed so as to extend below the guide rail 65 into the discharge chamber 53 and is fastened to a drive belt 55. The drive belt 55 moves the vertical guide rail 67 along the guide rail 65.

Figure 7:
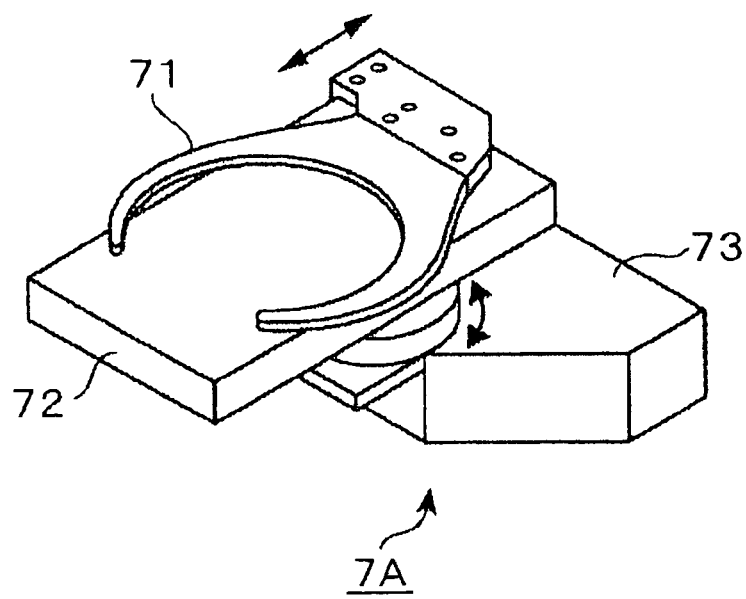
FIG. 7 is a perspective view of a shuttle arm moving unit in the DEV layer.

The carrying block M1 will be described with reference to FIGS. 2, 6 and 7. A carrying block M1 carries a wafer W from the carrier handling block S1 directly to the interface block S3. The carrying block M1 is interposed between the DEV layer B1 and the BCT layer B2. The carrying block M1 has a carrying space M2 separated from the carrying passage R1 of the DEV layer B1 by a partition plate 70a. The carrying block M1 is provided with a shuttle arm 7, namely, a direct carrying means. The shuttle arm 7 has a moving unit 7A and a drive unit 7B. The moving unit 7A moves in the carrying space M2. The moving unit 7A is provided with an arm member 71. For example, a peripheral part of the back surface of a wafer W is seated on the arm member 71. The arm member 71 is supported on a carrier base 72 for forward and backward movement. The carrier base 72 is supported on a moving base 73 so as to be turnable about a vertical axis.

The arm member 71, the carrier base 72 and the moving base 73 constitute the moving unit 7A. If the moving unit 7A is not subject to dimensional restrictions, the moving unit 7A may be provided with a lifting mechanism for vertically moving the carrier base 72.

The drive unit 7B has a box 70 defining a discharge chamber 70a. The drive unit 7B for moving the moving unit 7A is placed in the discharge chamber 7a. A guide rail 74 for guiding the moving unit 7a for transverse movement is extended transversely in front of the box 70. The shuttle arm 7 carries a wafer directly between a transfer stage TRS1B included in the shelf unit U5 and a transfer stage TRS5B included in the shelf unit U6.

The box 70 has a wall facing the carrying space M2 and provided with a suction opening 75. The guide rail 74 is provided with openings 74a arranged at transverse intervals so as to correspond to the suction opening 75. The back wall, opposite the front wall facing the carrying space M2, of the box 70 defining the discharge chamber 70a is provided with a plurality of discharge openings 77 arranged at transverse intervals. A discharge pipe 78 is connected to the discharge openings 77 to evacuate the discharge chamber 70a at a negative pressure. The drive unit 7B is formed so as to suck gas from the carrying space M2 into the discharge chamber 70a by evacuating the discharge chamber 70a at a negative pressure.

A gas supply unit 79 provided with, for example, a rectangular box is placed in the carrying space M2 so as to extend over the entire transverse length of the carrying space M2. The front wall, facing the carrying space M2, of the box 70 is provided with gas supply openings, not shown, arranged at fixed transverse intervals. A clean gas flowing through the gas supply unit 79 is blown through the gas supply openings so as to be diffused in the carrying space M2. The clean gas is supplied through the gas supply openings into the carrying space M2 and is discharged from the carrying space M2 through the discharge chamber 70a to remove particles from the carrying space M2. For example, flow of external air carrying particles from outside the coating and developing system into the carrying space M2 can be suppressed by properly controlling the supply of the clean gas into the carrying space M2 and the discharge of the clean gas from the carrying space M2.

Parts, adjacent to the carrier handling block S1, of the wafer carrying passage R1 and the carrying space M2 form a first wafer transfer space R2. As shown in FIGS. 1 and 3, the shelf unit U5 is disposed in the first wafer transfer space R2 so that the main arm A1, the shuttle arm 7 and the transfer arm C are able to access the shelf unit U5. A transfer arm D1, namely, vertically movable carrying means, for transferring a wafer W to the shelf unit U5 is disposed in the first wafer transfer space R2.

In the shelf unit U5, transfer stages TRS1B and TRS1 are disposed for the first unit block B1. The transfer stage TRS1B is put on top of the transfer stage TRS1. The transfer arm C, the shuttle arm 7 and the transfer arm D1 are able to access the transfer stage TRS1B. The main arm A1, the transfer arm C and the transfer arm D1 are able to access the transfer stage TRS1. Each of the transfer stages TRS1 and TRS1B has a square box, and a stage for supporting a wafer W. The stage is provided with a temperature adjusting mechanism for adjusting the temperature of a wafer W supported thereon to a predetermined temperature, and pins capable of being projected from the upper surface of the stage. The arm is able to advance into the box through an opening formed in a wall, facing the arm, of the box and to move into a space under a wafer W supported on the pins to support the wafer W thereon. Each of the arms is able to place a wafer W on the pins projecting from the stage.

As shown in FIG. 3, unit blocks B2, B3 and B4 are provided with two transfer stages TRS2, two transfer stages TRS3 and two transfer stages TRS4, respectively. The transfer stages TRS2 to TRS4 have the foregoing construction. A wafer W can be transferred between a main arm A2 and each of the transfer stages TRS2, between a main arm A3 and each of the transfer stages TRS3 and between a main arm A4 and each of the transfer stages TRS4. The transfer arm D1 is able to transfer a wafer W to and to receive a wafer W from each of the transfer stages TRS2 to TRS4. Each of the transfer stages TRS2 is able to transfer a wafer W to and to receive a wafer W from the transfer arm C. There is no limit to the number of the transfer stages TRS; each of the unit blocks may be provided with more than two transfer stages.

The transfer arm D1 moves to positions respectively corresponding to the unit blocks B1 to B4. The transfer arm D1 is able to move vertically and horizontally to transfer a wafer W to and receive a wafer W from each of the transfer stages TRS1 to TRS4 and the transfer stage TRS1B. The transfer stages TRS1 and TRS2 and the transfer stage TRS1B transfer a wafer W to and receive a wafer W from the transfer arm C.

Parts, adjacent to the interface block S3, of the wafer carrying passage R1 of the DEV layer B1 and the carrying space M2 of the carrying block M1 form a second wafer transfer space R3. As shown in FIG. 3, the shelf unit U6 is installed in the second wafer transfer space R3. The shelf unit U6 has an upper transfer stage TRS5B and a lower transfer stage TRS5. The transfer stage TRS5B is able to transfer a wafer W to and to receive a wafer W from each of the shuttle arm 7 and an interface arm B. The transfer stages TRS5B and TRS5 are similar in construction to, for example, the transfer stage TRS1B and have a cooling function to cool a wafer W. The transfer stages TRS5B and TRS5 are able to control the temperature of a wafer W.

Figure 8:
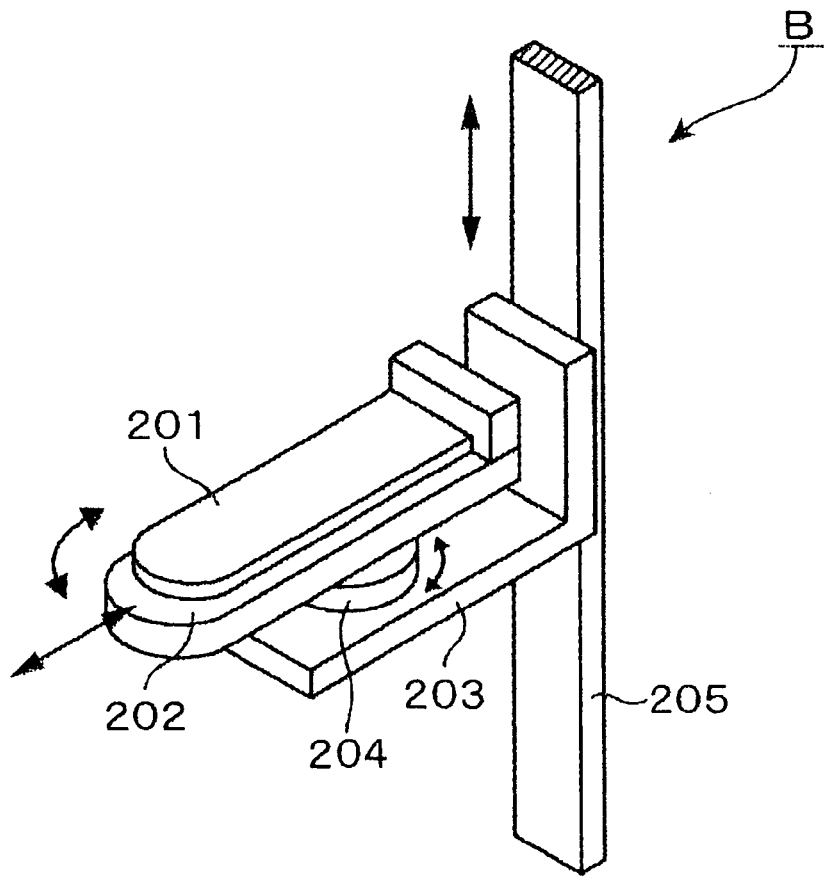
FIG. 8 is a perspective view of an interface arm included in the coating and developing system shown in FIG. 1.

The exposure system S4 is connected to the back end of the shelf unit U6 of the processing block S2 by the interface block S3. The interface block S3 is provided with the interface arm B. A wafer W is transferred between the interface arm B and the shelf unit U6 of the processing block S2 and between the interface arm B and the exposure system S4. As shown in FIG. 8 by way of example, the interface arm B has a base 202, an arm member 201 supported on the base 202 for movement in opposite directions, a lifting member 203 supporting the base 202, a turning mechanism 204 supporting the base 202 for turning abut a vertical axis on the lifting member 203, and a vertical rail 20-5 guiding the lifting arm 203 for vertical movement. The arm member 201 can be advanced and retracted, can be vertically moved and can be turned about a vertical axis. The transfer arm D1 is similar in construction to the interface arm B, except that the transfer arm D1 does not turn about a vertical axis.

The interface arm B is a wafer carrying means for carrying a wafer W between the processing block S2 and the exposure system S4. In this embodiment, the interface arm B receives a wafer W from the transfer stage TRS5B of the unit 6, carries the wafer W to the exposure system S4, receives the wafer W from the exposure system S4 and carries the wafer W to the transfer stage TRS5.

The other unit blocks will be briefly described. The BCT layer B2, the COT layer B3 and the TCT layer B4 are substantially similar in construction to the DEV layer B1 and differ from the DEV layer B1 in using a chemical liquid for forming an antireflection film or a chemical liquid (liquid resist) for forming a resist film instead of using the developer, carrying out coating methods different from the coating method to be carried out by the DEV layer B1, shelf units U1 to U4 having heating devices and cooling devices that operates on process conditions different from those on which the devices of heating and cooling systems of the DEV layer B1 operate, and not having any unit corresponding to the shelf unit U6 on the side of the interface unit S3. One of the unit blocks B2 to B4 is provided with a periphery-exposing exposure unit for exposing a peripheral part of a wafer W. The shelf units U1 to U4 of the COT layer B3 include hydrophobicity imparting units for imparting hydrophobicity to a wafer W.

The coating and developing system is provided with a controller 100 having a program storage unit, such as a computer. The program storage unit stores programs, namely, pieces of software, including instructions specifying operations for the coating and developing system to execute, such as processes for processing wafers W, wafer transferring operations, operations for controlling discharging and air flow and operations for managing recipes of the carrying passages. The controller 100 reads the programs from the program storage device and controls the operations of the coating and developing system according to the programs. The program storage unit holds recording mediums holding the programs, such as hard disks, compact disks or magnetoopetical disks.

The recipes of carrying passages specify wafer carrying passages along which wafers W are to be carried for different processes; that is the recipes of carrying passages specify order of modules including the transfer stages and the units. The recipes are produced beforehand respectively for the processes. The operator selects one of the processes, and then the controller 100 reads the recipe for the selected process from the program. A processing mode for carrying a test wafer W to the exposure system to inspect the exposure system, namely, an exposure system inspecting mode, is another choice other than the processes for processing wafers W to fabricate products. When this processing mode, namely, the exposure system inspecting mode, is selected, the shuttle arm 7 carries a wafer W from the carrier handling block S1 to the interface block S3 and carries the wafer W from the interface block S3 back to the carrier handling block S1.

The flow of a wafer W will be described on an assumption that the coating and developing system operates to form a resist film a lower antireflection film underlying the resist film and an upper antireflection film overlying the resist film. A carrier 20 is delivered to the carrier handling block S1. The transfer arm C takes out a wafer W from the carrier 20 and transfers the wafer W to the transfer stage TRS2 of the shelf unit U5. Then, the wafer W is transferred from the transfer stage TRS2 to the main arm A2 of the BCT layer B2. The main arm A2 carries the wafer W in the BCT layer B2 to the cooling unit, the antireflection film forming unit, not shown, corresponding to the developing unit 3 shown in FIG. 5, the heating unit and the transfer stage TRS2 of the shelf unit U5 in that order. Thus a lower antireflection film is formed.

Subsequently, the transfer arm D1 carries the wafer W from the transfer stage TRS2 to the transfer stage TRS3 of the COT layer B3. Then, the main arm A3 of the COT layer B3 carries the wafer W from the transfer stage TRS3 to the cooling unit, the resist applying unit, not shown, corresponding to the developing unit 3 shown in FIG. 5, and the heating unit in that order. Thus a resist film on the lower antireflection film is formed. Then, the wafer W is carried to the periphery-exposing exposure unit for exposing a peripheral part of the wafer W. Then, the wafer W is carried to the transfer stage TRS3 of the shelf unit U5.

Subsequently, the transfer arm D1 carries the wafer W from the transfer stage TRS3 to the transfer stage TRS4 of the TCT layer B4. Then, the main arm A4 of the TCT layer B4 carries the wafer W to the cooling unit, the second antireflection film forming unit, not shown, corresponding to the developing unit 3 shown in FIG. 5, and the heating unit in that order. Thus an upper antireflection film is formed on the resist film. Then, the wafer W is carried to the transfer stage TRS4 of the shelf unit U5.

Then, the transfer arm D1 carries the wafer W from the transfer stage TRS4 to the transfer stage TRS1B. Subsequently, the moving unit 7A of the shuttle arm 7 receives the wafer W, turns toward the interface block S3 and moves toward the interface block S3 to carry the wafer W to the transfer stage TRS5B. The interface arm B carries the wafer W from the transfer stage TRS5B to the exposure system S4. The exposure system S4 processes the wafer W by a predetermined exposure process.

After the completion of the exposure process, the interface arm B carries the wafer W to the transfer stage TRS5 of the shelf unit U6. Then, the main arm A1 of the DEV layer B1 carries the wafer W to the heating unit, the cooling unit, the developing unit 3, the heating unit and the cooling unit of the shelf units U1 to U4 of the DEV layer B1 in that order to process the wafer W by a predetermined developing process. After the completion of the developing process, the wafer W is carried to the transfer stage TRS1 of the shelf unit U5. Then, the transfer arm C carries and returns the wafer W to the carrier 20 held in the carrier handling block S1.

Figure 9:
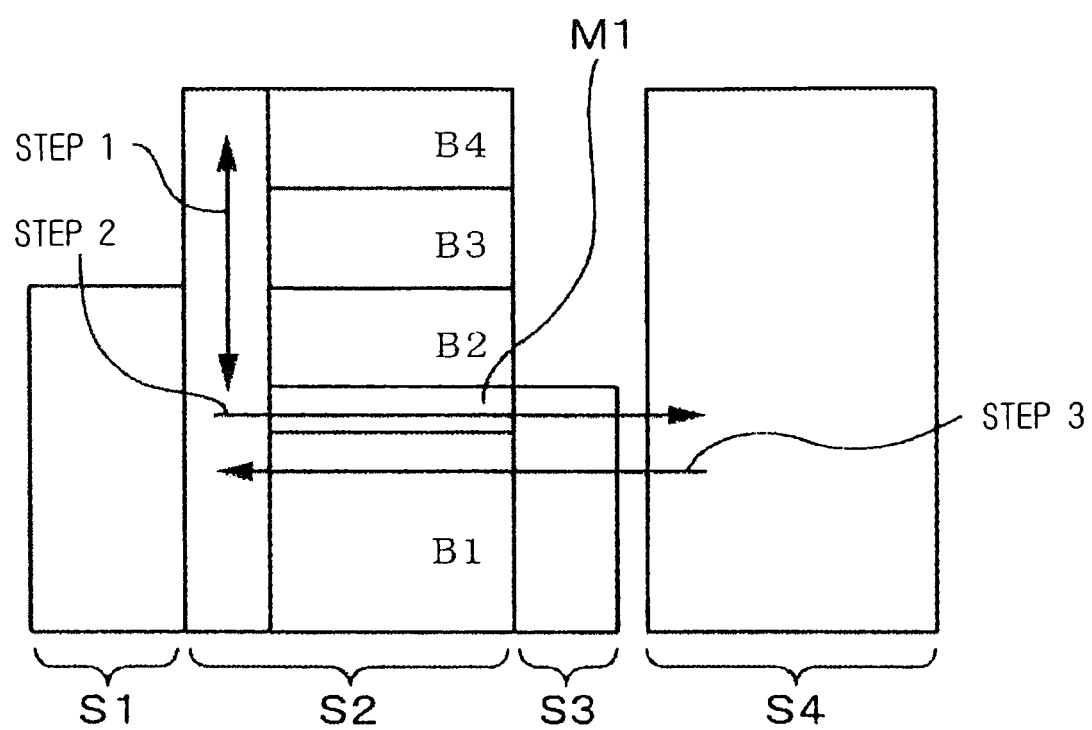
FIG. 9 is a typical view of assistance in explaining a wafer carrying path in the coating and developing system shown in FIG. 1.
Figure 10:
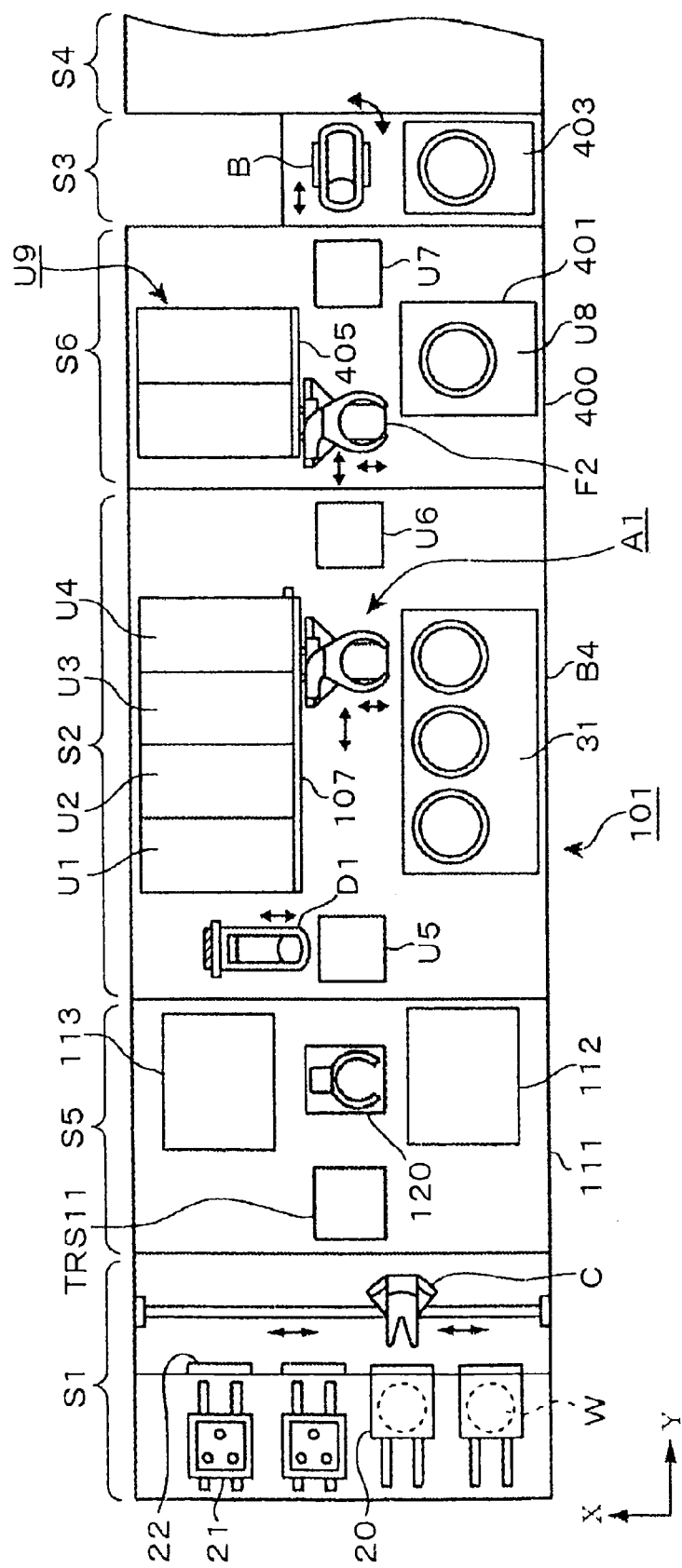
FIG. 10 is a plan view of a coating and developing system in a second embodiment according to the present invention.

FIG. 9 typically shows the carrying passages along which the wafer W is carried for the foregoing processes. The wafer W is moved in the film forming unit blocks B2 to B4 to form the films (Step 1). The wafer W is carried from a part, on the side of the carrier block S1, of the processing block S2 via the carrying block M1 to a part, on the side of the interface block S3, of the processing block S2 by the shuttle arm 7, and is carried to the exposure system S4 (Step 2). The wafer W processed by the exposure process is returned from the exposure system S4 to the DEV layer B1, is processed by the developing process by the DEV layer B1 and is returned to the carrier handling block S1 (Step 3).

Description will be made of a carrying passage along which a wafer W is carried directly to the exposure system S4 for the maintenance of the exposure system S4 without being processed by the unit blocks B2 to B4. The controller 100 selects an exposure system inspection mode. Then, a carrier 20 is delivered to the carrier handling block S1. The transfer arm C takes out a test wafer having a surface coated with, for example, a resist film from the carrier 20 and carries the test wafer W to the transfer stage TRS1B. The moving unit 7A of the shuttle arm 7 carries the test wafer W from the transfer stage TRS1B directly to the transfer stage TRS5B. The interface arm B carries the test wafer W from the transfer stage TRS5B to the exposure system S4. The test wafer W is used for maintenance work for adjusting the focusing accuracy and positioning accuracy of the exposure system S4, examining the distortion and transmittance of lenses, and inspecting the optical system for contamination with dust.

After the completion of the maintenance work, the interface arm B carries the test wafer W from the exposure system S4 to the transfer stage TRS5B. Then, moving unit 7A of the shuttle arm 7 carries the test wafer W from the transfer stage TRS5B directly to the transfer stage TRS1B. Then, the test wafer W is returned from the transfer stage TRS1B to the carrier 20 by the transfer arm C.

The processing block S2 of the coating and developing system in this embodiment has the layered structure of the coating unit blocks B2 to B4 and the developing unit block B1 extending between the carrier handling block S1 and the interface block S3. Therefore, the coating and developing system needs a narrow floor space for installation. The carrying block M1 is disposed between the DEV layer B1 and the BCT layer B2, and the carrying block M1 is provided with the shuttle arm 7 for carrying a wafer W from the carrier handling block S1 directly to the interface block S3. Therefore, operations for the maintenance of the exposure system S4, the coating unit blocks B2 to B4 and the developing unit block B1 can be simultaneously executed and hence time necessary for maintenance can be curtailed. Even if the coating unit blocks B2 to B4 and the developing unit block B1 are under maintenance work or those unit blocks are inoperative due to a trouble, such as a trouble in the discharge system, the test wafer W for inspecting the exposure system S4 can be carried from the carrier handling block. S1 to the exposure system S4 by the shuttle arm 7 of the carrying block M1. Thus the inspection of the exposure system S4 can be executed at desired time. Therefore, operations for processing a wafer W for producing a product can be started immediately after the coating unit blocks B2 to B4 and the developing unit block B1 have become operative and the reduction of throughput can be suppressed. When the adjustment of the shuttle arm 7 is completed first before starting the coating and developing system for the first time after the completion of installation, work for adjusting the exposure system S4 can be performed by carrying a test wafer W by the shuttle arm 7 independently of work for adjusting the main arms A1 to A4 of the developing unit block B1 and the coating unit blocks B2 to B4. When the adjustment of the exposure system S4 is completed, the exposure system S4 can be immediately set for exposure conditions and, consequently, time necessary for starting up the coating and developing system after installation can be curtailed. In the coating and developing system in this embodiment, the developing unit block B1 is disposed under the coating unit blocks B2 to B4, and the carrying block M1 having the shuttle arm 7 is interposed between the unit blocks B1 and B2. Therefore, the vertical stroke of the interface arm B of the interface block S3 may be short and hence the carrying means including the interface arm B can be formed in a small size.

The numbers of the layers of the unit blocks and order of stacking up the unit blocks are not limited to those mentioned above. For example, the coating unit blocks may be stacked up in order of the TCT layer, the COT layer and the BCT layer. The developing unit block may be placed on top of the layered structure of the coating unit blocks. When any antireflection films are not formed and only a resist film is formed on a wafer W, the coating and developing system may be provided with only the COT layer as a coating unit block. The lower antireflection film, the resist film and the upper antireflection film may be formed by a single coating unit block. The coating and developing system may be formed by stacking up a plurality of such layers. The DEV layer B1 may be provided with, for example, two superposed developing units similar to the developing unit 3.

Although the wafer carrying passage R1 of the DEV layer B1 is separated from the carrying space M2 of the carrying block M1 by the partition plate 70a to prevent particles from falling into the wafer carrying passage R1 in the coating and developing system in this embodiment, the partition plate 70a may be omitted. If the partition plate 70a is omitted, the moving space in which the moving unit 7A moves may be formed slightly above the upper end of the main arm A1 at the upper end of the moving space in which the main arm A1 moves to prevent interference between the main arm A1 and the moving unit 7A.

The shuttle arm 7, namely, a direct carrying means, may be any suitable mechanism other than that mentioned above. For example, the shuttle arm 7 may include, instead of the carrier base 72 and the arm member 71 that moves along the carrier base 72, an arm member 71 and an swivel base 72 supporting the arm member 71 and capable of turning so as to insert the arm member 71 in a space under a wafer W lifted up by the pins of the transfer stage TRS1B or TRS5B to support the wafer W on the arm member 71 and of turning so as to carry the wafer W between the transfer stages TRS1B and TRS5B.

The direct carrying means needs only to carry a wafer W directly from the carrier handling block S1 to the interface block S3 without passing either of the coating unit and the developing unit. Therefore, the direct carrying means may be a belt conveyor mechanism instead of the carrying arm mechanism. For example, the transfer stages TRS1B and TRS5B may be formed in a U-shape, a conveyor belt may be extended between spaces formed in the U-shaped transfer stages TRS1B and TRS5B to carry a wafer between the transfer stages TRS1B and TRS5B. Another possible direct carrying means may have a member extended between the transfer stages TRS1B and TRS5B, having a slope sloping down toward the transfer stage TRS5B, and provided with side guide rails for preventing a wafer W from falling off the slope and with air jetting holes in a part, on the side of the transfer stage TRS5B, of the slope. A wafer W can be pushed on to the transfer stage TRS5B by the weight of the wafer W and the pressure of air jetted through the air jetting holes.

The direct carrying means included in the coating and developing system according to the present invention is intended for directly carrying a wafer W between the carrier handling block and the interface block without passing either of the coating unit and the developing unit. However, for example, a periphery-exposing exposure unit and an inspection unit may be disposed on the carrying passage of the direct carrying means. Direct carrying signifies also carrying a wafer between the respective carrying means of the carrier handling block and the interface block through the periphery-exposing exposure unit and the inspection unit.

A coating and developing system 101 in a second embodiment according to the present invention will be described with reference to FIGS. 10 to 13. The coating and developing system 101 includes a carrier handling block S1, a processing block, S2, an interface block S3, an inspection block S5 for inspecting wafers W by a predetermined inspecting method interposed between the carrier handling block S6 and the processing block S2, and an auxiliary block S6 interposed between the processing block S2 and the interface block S3. The auxiliary block S6 is provided with water-repellent protective film forming units (ITC) (hereinafter, referred to simply as "protective film forming units (ITC)") and water-repellent protective film removing units (ITR) (hereinafter, referred to simply as "protective film removing units (ITR)"). The protective film forming units (ITC) form a protective film on a resist film to prevent the resist film from being impregnated with a liquid used for immersion exposure. The protective film removing units (ITR) remove the protective film. The interface block S3 is provided with cleaning units (RD) for cleaning a wafer W before and after processing the wafer W by immersion exposure.

Immersion exposure will be briefly described. An immersion exposure method exposes a surface of a substrate through a transparent liquid layer formed on the surface of the substrate to improve the resolution of exposure. Immersion exposure utilizes the characteristic of light that the wavelength of light shortens in pure water. For example, the wavelength of ArF light shortens from 193 nm in air to about 134 nm in water.

When a liquid layer is formed on the surface of a resist film formed on a wafer W for immersion exposure, the resist is likely to be eluted by the liquid layer, an eluate containing the resist eluted by the liquid layer is likely to remain on the wafer W, and liquid drops are likely to remain on the surface of the wafer W after the liquid layer is removed from the wafer after an exposure process. If the eluates containing the resist remain on the wafer W, particles causative of defects may be produced on the surface of the wafer W. Particles produced from the eluate stick to or melts on the wafer when the wafer W is subjected to a heating process after the exposure process. Particles sticking to or melted on the wafer W affect adversely to the line-width of a pattern. Liquid drops remaining on the wafer W after the exposure process cause the wafer W to be heated by a heating process in an irregular intrasurface temperature distribution and the heating process is unable to heat the wafer W uniformly. Water marks are likely to be formed on the surface of the wafer W due to interaction between the liquid drops and air.

When a wafer W is to be subjected to an immersion exposure process, a water-repellent protective film is formed on a resist film formed on a surface of the wafer W to prevent the dissolution of the resist forming the resist film into a liquid used for immersion exposure and to restrain the liquid used for immersion exposure from remaining on the surface of the wafer W. The protective film forming unit (ITC) forms the water-repellent protective film. The resist film cannot be dissolved in a developer unless the protective film coating the resist film is removed. The protective film removing unit (ITR) removes the protective film. The surface of the wafer W is cleaned by the cleaning unit (RD) after the completion of the immersion exposure process to ensure that the eluate containing the resist and water drops, namely, drops of the liquid used for immersion exposure, remaining on the surface of the wafer are removed completely.

Figure 11:
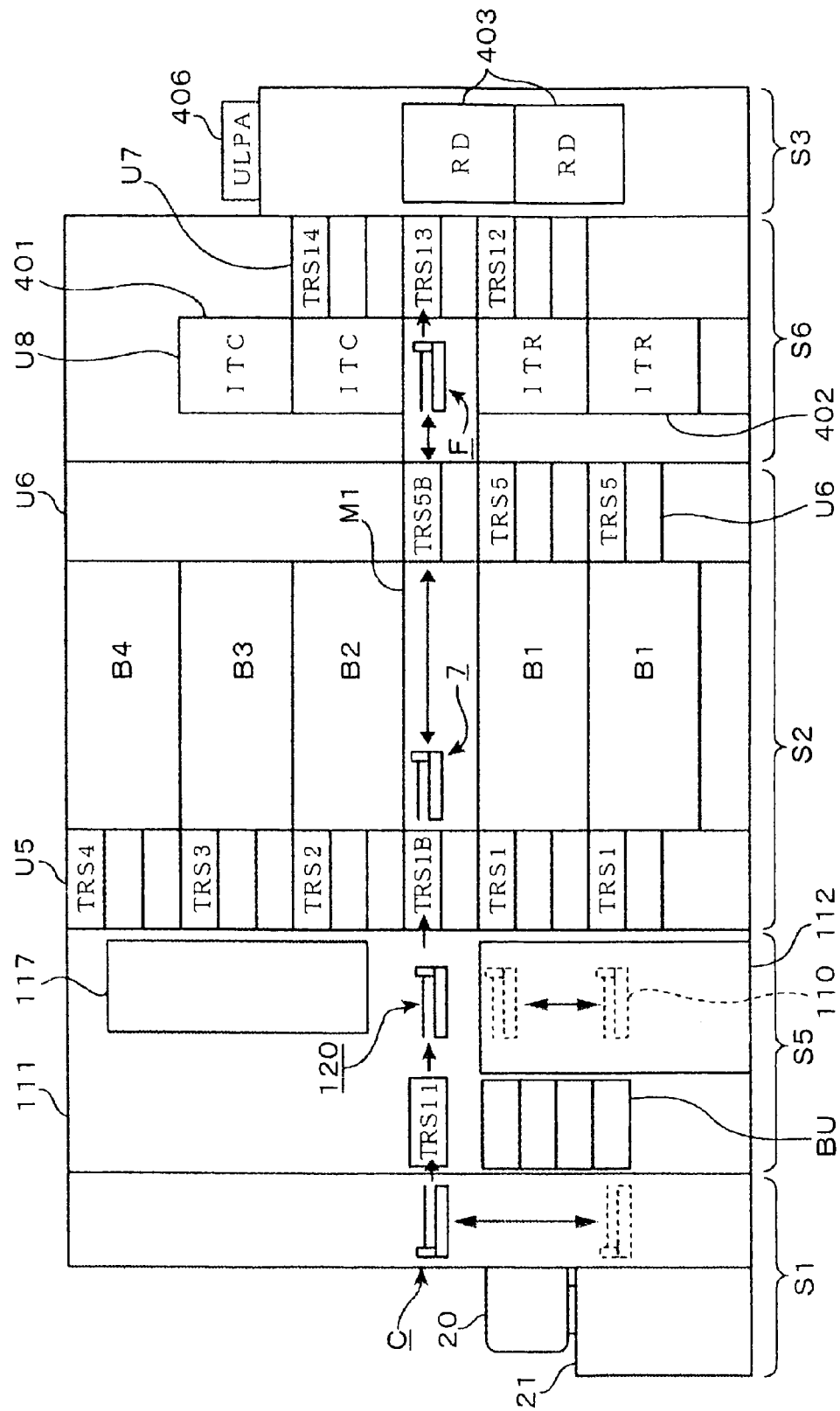
FIG. 11 is a sectional side elevation of the coating and developing system shown in FIG. 10.

The processing block S2 of the coating and developing system 101 includes two layered DEV layers B1 and B2. The upper DEV layer B1 is formed in a carrying block M1. In FIG. 11, only top transfer stages TRS1 to TRS5 of shelf units U5 and U6 for the unit blocks B1 to B4 are shown for convenience.

Figure 12:
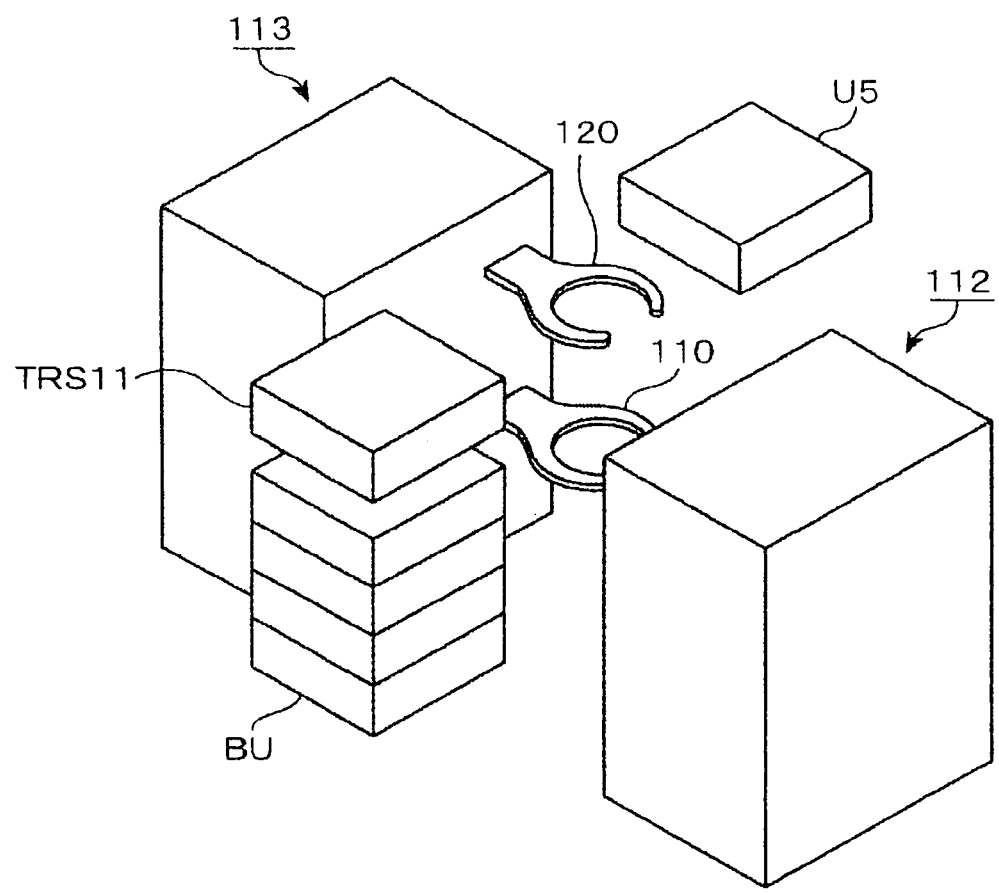
FIG. 12 is a perspective view of an inspection block included in the coating and developing system shown in FIG. 10.
Figure 13:
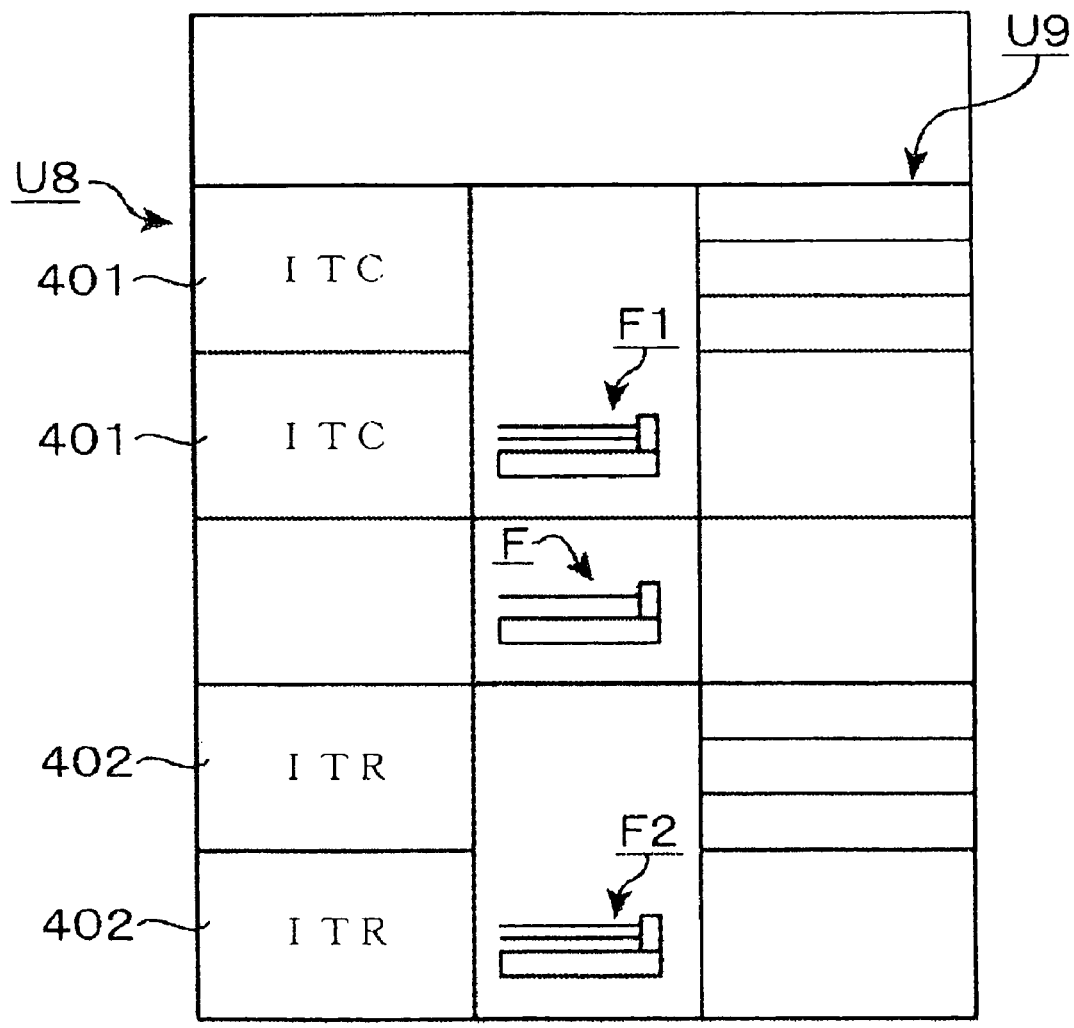
FIG. 13 is longitudinal sectional view of an auxiliary block included in the coating and developing system shown in FIG. 10.

The construction of the inspection block S5 will be described with reference to FIG. 12. The inspection block S5 has a box 111 isolating the inspection block S5 from the surroundings. Suppose that the carrier handling block S1 is on the front side and the processing block S2 is on the back side. Then, a transfer stage TRS11 is disposed at a front position in a middle part of the interior of the box 111. A transfer arm C included in the carrier handling block S1 delivers a wafer W to the transfer stage TRS11. The transfer stage TRS11 is similar in construction to the transfer stages TRS1 to TRS5. Five buffer units BU are stacked in five layers under the transfer stage TRS11. Each of the buffer units BU is capable of holding a predetermined number of wafers W, for example, between ten and about twenty wafers W. An arm 110 carries a wafer W processed by a developing process in the DEV layer B1 is carried, for example, into the buffer unit BU and is held for temporary storage in the buffer unit BU. A transfer arm C carries a wafer W held in the buffer unit BU to a carrier 20.

Inspection units 112 and 113 are disposed on the right and the left side, respectively, in the box 111 of the inspection block 5. Although the inspection block S5 is supposed to have the two inspection units 112 and 113 by way of example, the number of inspection units is dependent on the number of characteristics to be inspected. The inspection block S5 may be provided with the two inspection units 112 and 113 like this embodiment, one of the two inspection units 112 and 113 may be a film thickness inspection unit for inspecting the thickness of a film formed on a wafer W and the other inspection unit may be used for forming an image of a surface of a wafer W by an image forming device, such as a CCD camera, and for analyzing the image of the surface. The latter inspection unit inspects the surface of the wafer W for defects formed by developing and inspects the line-width of a resist pattern formed on the surface of the wafer W. The inspection units 112 and 113 may include, for example, some of a defocus inspecting device for inspecting a pattern for dislocation in an exposure system, an irregular coating finding device for fining irregularities in a liquid resist coating, a faulty development finding device for finding defects caused by a developing process, a particle counting device for counting the number of particles adhering to a substrate, a comet detecting device for detecting comets formed in a resist film formed on a substrate, a splash-back detecting device, a defect detecting device for detecting defects in a surface of a substrate, a scum detecting device for detecting residual resist remaining on a substrate processed by a developing process, Fault finding device for finding faults in a resist film forming process and/or a developing process, a line-width measuring device for measuring the width of lines of a resist pattern formed on a substrate and a registration examining device for examining the accuracy of registration of a photomask with respect to a substrate after exposure selected according to desired objects of inspection.

A transfer arm 110 for transferring a wafer W is disposed in a back central part of the space in the box 11 of the inspection block S5. The transfer arm 110 is vertically movable, horizontally movable and turnable about a vertical axis. The transfer arm 110 is capable of accessing the inspection units 112 and 113 and the buffer units BU to transfer a wafer W from one to another of those units. The transfer arm 110 is also capable of accessing the transfer stages TRS1 of the processing block S2 to transfer a wafer processed by the developing process between the inspection block S5 and the processing block S2.

A shuttle arm 7 placed in the carrying block M1 of the processing block S2 is called a first shuttle arm. A second shuttle arm 120, namely, a second direct carrying means for carrying a wafer W, is disposed above the transfer arm 110. The second shuttle arm 120 is vertically movable, horizontally movable and turnable about a vertical axis. When an exposure check mode is selected from a recipe, the shuttle arm 120 carries a wafer W between the transfer stage TRS11 and the transfer stage TRS1B of the shelf unit U5 of the processing block S2. An electrical unit 117 is disposed above the inspection units 112 and 113. The electrical unit 117 includes electric devices for operating the units of the coating and developing system 101.

The auxiliary block S6 will be described. The auxiliary block S6 has a box 400 isolating the auxiliary block S6 from the surroundings. Shelf units U7, U8 and U9 are disposed in a back central part, a right part and a left part, respectively, in the box 400. The shelf unit U7 has two transfer units TRS12 and TRS13 for receiving a wafer from and transferring a wafer W to an interface arm B included in the interface block S3 and two transfer stages TRS14. The transfer stages TRS12, TRS13 and TRS14 stacked upward in that order. For example, the transfer stages TRS12, TRS13 and TRS14 are similar in construction to the transfer stages TRS1 to TRS5.

The shelf unit U8 is divided into an upper section and a lower section. Two protective film forming units (ITC) 401 are stacked in the upper section. Two protective film removing units (ITR) 402 are stacked in the lower section. The shelf unit U9 includes, for example, an inspection unit for inspecting a wafer W at a stage after a film forming process and before an exposure process, at a stage after an exposure process and before a developing process and at a stage after a developing process, units of a cooling and heating system, such as a cooling unit (COL) and a heating unit (CHP). Those units of the shelf unit U9 are stacked in layers. In FIG. 11, only one transfer stage TRS12 and only one transfer stage TRS14 are shown for convenience.

For example, the two protective film removing units 402 are disposed so as to correspond respectively to the two DEV layers B1 and B2, and the two protective film forming units 401 are disposed so as to correspond respectively to the BCT layer B2 and the COT layer B3.

The two transfer stages TRS12 of the shelf unit U7 are disposed so as to correspond to the protective film removing units 402. The two transfer stages TRS14 are disposed so as to correspond to the protective film forming units 401. For example, the transfer stage TRS14 is used for transferring a wafer W from the auxiliary block S6 to the interface block S3, while the transfer stage TRS12 is used for transferring a wafer W from the interface block S3 to the auxiliary block S6. The transfer stage TRS13 is disposed so as to correspond to the carrying block M1. A shuttle arm F transfers a wafer W between the transfer stage TRS13 and the carrying block M1.

The auxiliary block S6 is provided with an upper transfer arm F1 and a lower transfer arm F2. The upper transfer arm F1 carries a wafer to and receives a wafer from the devices of the shelf units U7, U8 and U9 of the auxiliary block S6. For example, the upper transfer arm F1 carries a wafer to and receives a wafer from the two protective film forming units 401 of the shelf unit U8, the transfer stage TRS14 of the shelf unit U7 and the relevant devices of the shelf unit U9.

The lower transfer arm F2 carries a wafer W to and receives a wafer W from the DEV layers B1 of the processing block S2 and the devices of the shelf units U7, U8 and U9 of the auxiliary block S6. For example, the lower transfer arm F2 carries a wafer W to and receives a wafer W from the transfer stages TRS5 of the shelf unit U6 of the processing block S2, the two protective film removing units 402 of the shelf unit U8, the transfer staged TRS12 of the shelf unit U7 and the relevant devices of the shelf unit U9.

The transfer arms F1 and F2 are similar in construction to, for example the main arms A1 to A5. The transfer arms F1 and F2 are horizontally movable in Y-directions along Y-axis rails 405 extended in working ranges of the transfer arms F1 and F2 on a base, not shown, on which the shelf unit U8 is installed, vertically movable and turnable about a vertical axis.

The shuttle arm F, namely, a third direct carrying means, is disposed between the transfer arms F1 and F2. The shuttle arm F is horizontally movable, vertically movable and turnable about a vertical axis. The shuttle arm F carries a wafer between the transfer stage TRS5B of the shelf unit U6 of the processing block S2 and the transfer stage TRS13 of the shelf unit U8 of the auxiliary block S6.

For example, two cleaning units (RD) 403 are stacked in the interface block S3. The interface arm B is able to access the two cleaning units (RD) 403. The cleaning units (RD) 403 clean a wafer processed by an immersion exposure process.

A ULPA filter 406 is put on the interface block S3. The ULPA filter 406 clear air of dust and supplies clean air into the interface block S3.

The construction of the protective film forming unit 401, the protective film removing unit 402 and the cleaning unit 403 will be briefly described. The protective film forming unit 401, the protective film removing unit 402 and the cleaning unit 403 are substantially the same in construction as the resist film forming unit of the processing block S2 and differ from the resist film forming unit in that each of the protective film forming unit 401, the protective film removing unit 402 and the cleaning unit 403 is provided with a spin chuck, namely, a holding device for holding a wafer W disposed in the box thereof. The protective film forming unit 401 uses a chemical solution for forming a protective film, the protective film removing unit 402 uses a peeling solution for removing a protective film formed by the protective film forming unit 401 and the cleaning unit 403 uses a cleaning liquid for cleaning a wafer W processed by an immersion exposure process instead of the liquid resist.

In the coating and developing system in the first embodiment shown in FIG. 1, the shuttle arm 7 included in the carrying block M1 is a direct carrying means for directly carrying a wafer between the carrier handling block S1 and the interface block S3. In the coating and developing system 101 in the second embodiment, the shuttle arm 120 included in the inspection block S5, the shuttle arm 7 included in the carrying block M1 and the shuttle arm F included in the auxiliary block S6 constitute a direct carrying means.

The coating and developing system 101 in the second embodiment, similarly to the coating and developing system in the first embodiment, has recipes specifying carrying routes respectively for the processes. The operator can select a process. A controller 100 reads a recipe for the selected process from a program. An exposure checking mode, namely, a processing mode for carrying a test wafer W for testing the exposure system to the exposure system, can be selected. When the exposure checking mode is selected, the three shuttle arms 120, 7 and F carry a wafer W from the carrier handling block S1 directly to the interface block S3 and return the wafer W from the interface block S3 directly to the carrier handling block S1.

Suppose that an exposure system S4 connected to the coating and developing system 101 carries out an immersion exposure process, and then a cleaning process is carried out. Then, for example, the transfer arm C takes out a wafer W from the carrier 20 and carries the wafer W from the carrier handling block S1 to the transfer state TRS11, and then the shuttle arm 120 carries the wafer W from the transfer stage TRS11 to the transfer stage TRS1B. Thus the wafer W is carried from the carrier handling block S1 through the inspection block S5 to the processing block S2. Then, the transfer arm D1 carries the wafer W from the transfer stage TRS2 via the BCT layer B2, the COT layer B3 and the TCT layer B4 to the transfer stage TRS4. Subsequently, the transfer arm D1 carries the wafer W to the transfer stage TRS1B, the shuttle arm 7 carries the wafer W to the transfer stage TRS5B of the shelf unit U6, and the shuttle arm F carries the wafer to the transfer stage TRS13. Thus the wafer W is carried from the processing block S2 to the auxiliary block S6. Then, the transfer arm F1 carries the wafer to the protective film forming unit 401 of the shelf unit U8, the transfer arm F1 of the auxiliary block S6 carries the wafer W to the transfer stage TRS14 of the shelf unit U7, and then the interface arm B of the interface block S3 carries the wafer W to the exposure system S4. The exposure system S4 processes the wafer W by an exposure process.

The interface arm B of the interface block S3 carries the wafer W processed by the exposure process to the cleaning unit 403 and from the cleaning unit 403 to the transfer stage TRS12 of the shelf unit U7 of the auxiliary block S6, and then the transfer arm F2 carries the wafer W to the protective film removing unit 402 of the shelf unit U8 and from the protective film removing unit 402 through the transfer stage TRS5 of the shelf unit U6 of the processing block S2 and the DEV layer B1 to the transfer stage TRS1 of the shelf unit U5.

Then, the transfer arm 110 of the inspection block S5 carries the wafer W through the buffer unit BU or directly to the inspection units 112 and 113. The transfer arm 110 carries the inspected wafer W to the buffer unit BU. The transfer arm C carries the wafer W from the buffer unit BU into the carrier 20. If the inspection units 112 and 113 include a film thickness measuring unit, a wafer W coated with a resist film by the COT layer B3 is subjected to film thickness measurement. The buffer unit BU exercises not only a function to transfer a wafer W to the transfer arm C of the carrier handling block S1, but also a function to hold wafers W in a lot other than one wafer W to be inspected out of a predetermined number of wafers W in the lot and to determine the order of carrying the wafers W in the lot.

Description will be made of a carrying route along which a wafer W is carried to the exposure system S4 for the maintenance of the exposure system. The carrying route bypasses the blocks B1 to B4. The controller selects an exposure checking mode. Then, a carrier 20 holding a test wafer W coated with, for example, a resist film is delivered to the carrier handling block S1. Then, a carrying procedure for carrying the test wafer W to the exposure system S4 is carried out; the transfer arm C carries the test wafer W to the transfer stage TRS11, the shuttle arm 120 carries the test wafer W to the transfer stage TRS1B of the shelf unit U5, the shuttle arm 7 carries the test wafer W to the transfer stage TRS5B of the shelf unit U6, the shuttle arm F carries the test wafer W to the transfer stage TRS13 of the shelf unit U7, and the interface arm B carries the test wafer W to the exposure system S4. Then, maintenance work similar to that mentioned in the description of the first embodiment is carried out. The carrying procedure for carrying the test wafer W to the exposure system S4 is reversed to return the test wafer W into the carrier 20.

The coating and developing system 101 in the second embodiment includes the inspection block S5 interposed between the carrier block S1 and the processing block S2. Therefore, a single operator is able to monitor operations for resist application, exposure, development and inspection. Thus the coating and developing system 101 needs fewer operators. When some defects are found by inspection, the operator can promptly take action for finding and eliminating causes of the defects.

Since the auxiliary block S6 interposed between the processing block S2 and the interface block S3 is provided with the protective film forming units 401 and the protective film removing units 402, which are necessary when a wafer W is subjected to the immersion exposure process, the coating and developing system 101 can deal with both a case where immersion exposure is carried out and a case where immersion exposure is not carried out without changing the layout of the processing block S2. In the case where immersion exposure is not carried out, a wafer W may be passed through the auxiliary block S6 without processing the wafer W in the auxiliary block S6.

A wafer W is transferred via the transfer stage TRS1B between the second shuttle arm 120 of the inspection block S5 and the first shuttle arm 7 of the processing block S2. However, the first shuttle arm 7 and the second shuttle arm 120 operate for direct carrying even in a case where the first shuttle arm 7 and the second transfer arm 120 transfer a wafer to the different transfer stages, respectively, and the transfer arm D1 carries a wafer between the different transfer stages.

The number of the transfer stages TRS and the number of the units of each of the blocks of the coating and developing system 101 are not limited to those mentioned above. The foregoing coating and developing system may be provided with either of the inspection block S5 and the auxiliary block S6.

Figure 14:
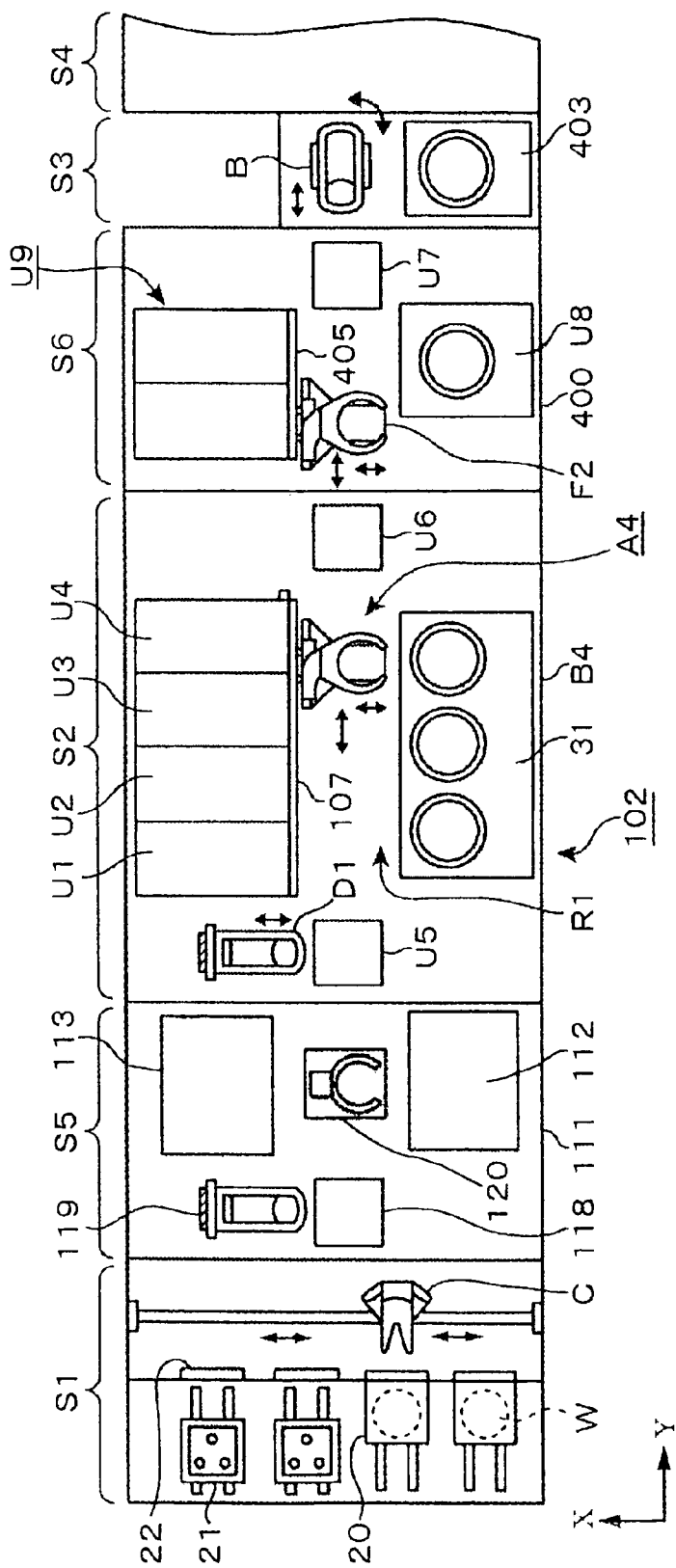
FIG. 14 is a plan view of a coating and developing system including the inspection block shown in FIG. 12 including a hydrophobicity imparting unit.
Figure 15:
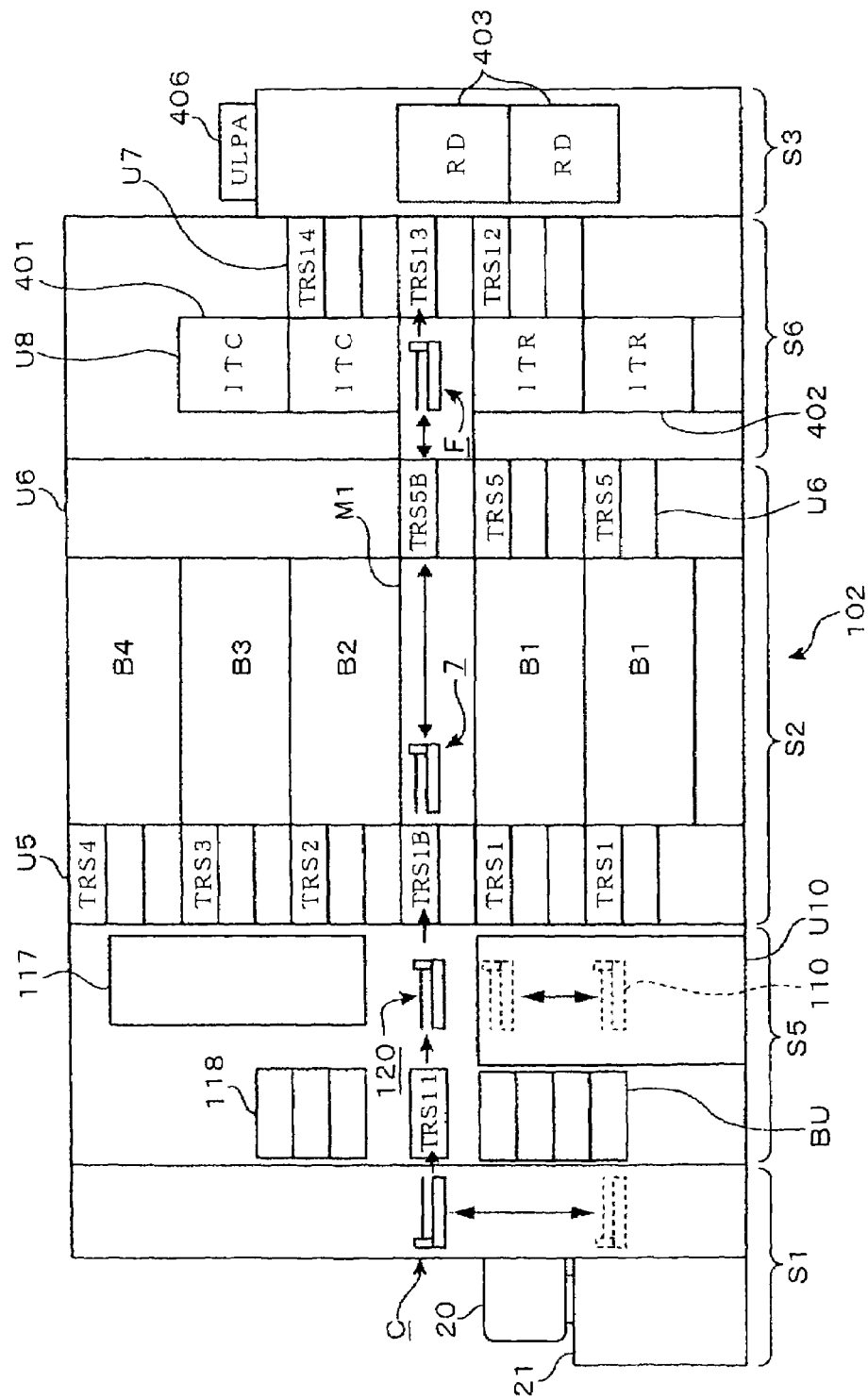
FIG. 15 is a longitudinal sectional view of the coating and developing system shown in FIG. 14.

The shelf units U1 to U4 of the COT layer B3 of the foregoing embodiments include the hydrophobicity imparting unit (ADH), the hydrophobicity imparting unit (ADH) may be included in the inspection block S5 as shown in FIGS. 14 and 15 instead of being included in the COT layer B3. More concretely, an inspection block S5 included in a coating and developing system 102 shown in FIGS. 14 and 15 is substantially similar to the inspection block S5 of the coating and developing system 101, except that the former inspection block S5 is provided with three hydrophobicity imparting units 118 stacked in layers above a transfer stage TRS11, and a transfer arm 119 placed in a front left-hand part of the inspection block S5. The transfer arm 119, similarly to a transfer arm D1 included in a processing block S2, is horizontally movable, vertically movable and turnable about a vertical axis. The transfer arm 119 can access the transfer stage TRS11 and the hydrophobicity imparting units 118.

To process a wafer W by an exposure process by an exposure system S4 connected to the coating and developing system 102, the transfer arm C takes out the wafer W from a carrier 20 delivered to a carrier handling block S1 and carries the wafer W to the transfer stage TRS11, the transfer arm 119 carries the wafer W to the hydrophobicity imparting unit 118 and carries the wafer W from the hydrophobicity imparting unit 118 to the transfer stage TRS11, a shuttle arm carries the wafer W to a transfer stage TRS1B. Thus the wafer W is carried from the carrier handling block S1 through the inspection block S5 to a processing block S2. The wafer W is processed by a hydrophobicity imparting process before forming a resist film on the wafer W when a lower antireflection film is not formed on the wafer W. The wafer W may be processed by the hydrophobicity imparting process before a lower antireflection film is formed on the wafer W. A route along which the coating and developing system 102 carries a wafer W to process the wafer W by the exposure process is similar to that along which the coating and developing system 101 carries a wafer W excluding a route along which the wafer W is carried to process the wafer W by the hydrophobicity imparting process. A route along which the coating and developing system 102 carries the wafer W processed by the exposure process to the carrier 20 is similar to that along which the coating and developing system 101 carries the wafer W processed by the exposure process to the carrier 20.

When an exposure check mode is selected, a test wafer W is carried along a route similar to that along which the coating and developing system 101 carries the test wafer W.

Load on the main arms A2 to A4 of the unit blocks when the hydrophobicity imparting units 118 are included in the inspection unit S5 is lower than that when the hydrophobicity imparting units are included in the shelf units U1 to U4 of the unit blocks B2 to B4

In the coating and developing system including at least either of the inspection block S5 and the auxiliary block S6, the shuttle arm 7 of the processing block S2 is equivalent to the direct carrying means for directly carrying a wafer between the carrier handling block S1 and the interface block S3 even if the inspection block S5 and the auxiliary block S6 are not provided with any shuttle arms and the test wafer W is carried when an exposure check mode is selected by the transfer arms for carrying a wafer W in the normal processing mode.

What is claimed is:

1. A coating and developing system comprising:
    a carrier handling block for receiving a carrier containing substrates;
    a processing block for forming films including a photosensitive film on a substrate received from the carrier handling block, for developing the exposed photosensitive film processed by an exposure system and for returning the substrate to the carrier handling block;
    an interface block for transferring the substrate from the processing block to the exposure system and transferring the substrate from the exposure system to the processing block; wherein
    a) the processing block has coating blocks, for forming the films including the photosensitive film on the substrate, extending between the carrier handling block and the interface block, and a developing block stacked as a layer with respect to the coating blocks,
    b) each of the coating blocks and the developing block is provided with a chemical liquid applying unit for applying a chemical liquid to the substrate, a heating unit for heating the substrate, a cooling unit for cooling the substrate and interblock carrying means for carrying the substrate from one to another of those units,
    c) a direct carrying means arrangement is stacked as a layer with respect to the coating block and the developing block to carry a substrate directly between the carrier handling block and the interface block, and
    d) the direct carrying means arrangement that carries a substrate coated with the films from a position on a side of the carrier handling block to a position on a side of the interface block, and
    further comprising an auxiliary block interposed between the processing block and the interface block and including a unit that carries out a process at a stage after a film has been formed and before an exposure process and/or at a stage after an exposure process has been completed and before a developing process, and transfer arms for carrying a substrate between each of those units and the processing block and between each of those units and the interface block; and
    wherein the direct carrying means arrangement includes a direct carrying means that passes through the processing block, and a direct carrying means that passes through the auxiliary block.

2. The coating and developing system according to claim 1, wherein the coating block includes a layered structure of a resist film forming block for forming a resist film, a first antireflection film forming block for forming a first antireflection film under the resist film, and a second antireflection film forming block for forming a second antireflection film over the resist film.

3. The coating and developing system according to claim 1, wherein the developing block is disposed below the coating block.

4. The coating and developing system according to claim 1, wherein the direct carrying means arrangement is formed to move in a carrying block separated from the coating block and the developing block.

5. The coating and developing system according to claim 4, wherein the carrying block is interposed between the developing block and the coating block.

6. The coating and developing system according to claim 4, further comprising a gas supply unit for supplying a gas into the carrying block to maintain the interior of the carrying block at a positive pressure.

7. The coating and developing system according to claim 1, further comprising:
    a plurality of transfer stages stacked in layers and arranged so that a substrate can be carried thereto and can be carried away therefrom by the interblock carrying means of the coating block, the interblock carrying means of the developing block and the direct carrying means arrangement; and
    vertical carrying means for carrying a substrate to and receiving a substrate from each of the plurality of transfer stages.

8. The coating and developing system according to claim 1, further comprising a controller for controlling carrying operations for carrying a substrate, wherein the controller is capable of selecting a test substrate carrying mode for carrying a test substrate from the carrier handling block to the exposure system by the direct carrying means arrangement to test the condition of the exposure system.

9. The coating and developing system according to claim 1, further comprising an inspection block for inspecting a substrate, interposed between the carrier handling block and the processing block and including an inspection unit for inspecting a substrate, and transfer arms for transferring a substrate from and to the inspection unit, the carrier handling block and the processing block;
    wherein the direct carrying means arrangement includes a direct carrying means that passes through the inspection block and a direct carrying means that passes through the processing block.

10. A coating and developing system comprising:
    a carrier handling block for receiving a carrier containing substrates;
    a processing block for forming films including a photosensitive film on a substrate received from the carrier handling block, for developing the exposed photosensitive film processed by an exposure system and for returning the substrate to the carrier handling block;
    an interface block for transferring the substrate from the processing block to the exposure system and transferring the substrate from the exposure system to the processing block; wherein
    a) the processing block has coating blocks, for forming the films including the photosensitive film on the substrate, extending between the carrier handling block and the interface block, and a developing block stacked as a layer with respect to the coating blocks,
    b) each of the coating blocks and the developing block is provided with a chemical liquid applying unit for applying a chemical liquid to the substrate, a heating unit for heating the substrate, a cooling unit for cooling the substrate and interblock carrying means for carrying the substrate from one to another of those units, c) a direct carrying means arrangement is stacked as a layer with respect to the coating block and the developing block to carry a substrate directly between the carrier handling block and the interface block, and d) the direct carrying means arrangement carries a substrate coated with the films from a position on a side of the carrier handling block to a position on a side of the interface block, and further comprising an inspection block for inspecting a substrate, interposed between the carrier handling block and the processing block and including an inspection unit for inspecting a substrate, and transfer arms for transferring a substrate from and to the inspection unit, the carrier handling block and the processing block;

wherein the direct carrying means arrangement includes a direct carrying means that passes through the inspection block and a direct carrying means that passes through the processing block.

11. The coating and developing system according to claim 10, wherein the coating block includes a layered structure of a resist film forming block for forming a resist film, a first antireflection film forming block for forming a first antireflection film under the resist film, and a second antireflection film forming block for forming a second antireflection film over the resist film.

12. The coating and developing system according to claim 10, wherein the developing block is disposed below the coating block.

13. The coating and developing system according to claim 10, wherein the direct carrying means arrangement is formed to move in a carrying block separated from the coating block and the developing block.

14. The coating and developing system according to claim 13, wherein the carrying block is interposed between the developing block and the coating block.

15. The coating and developing system according to claim 13, further comprising a gas supply unit for supplying a gas into the carrying block to maintain the interior of the carrying block at a positive pressure.

16. The coating and developing system according to claim 10, further comprising:

a plurality of transfer stages stacked up in layers and arranged so that a substrate can be carried thereto and can be carried away therefrom by the interblock carrying means of the coating block, the interblock carrying means of the developing block and the direct carrying means arrangement; and vertical carrying means for carrying a substrate to and receiving a substrate from each of the plurality of transfer stages.

17. The coating and developing system according to claim 10, further comprising a controller for controlling carrying operations for carrying a substrate, wherein the controller is capable of selecting a test substrate carrying mode for carrying a test substrate from the carrier handling block to the exposure system by the direct carrying means arrangement to test the condition of the exposure system.

* * * * *